US010389241B2

(12) United States Patent
Zeng et al.

(10) Patent No.: US 10,389,241 B2
(45) Date of Patent: Aug. 20, 2019

(54) POWER SUPPLY CONVERTER AND METHOD FOR MANUFACTURING THE SAME

(71) Applicant: Delta Electronics (Shanghai) CO., LTD, Shanghai (CN)

(72) Inventors: Jianhong Zeng, Shanghai (CN); Yu Zhang, Shanghai (CN); Min Zhou, Shanghai (CN); Jinping Zhou, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 274 days.

(21) Appl. No.: 15/409,666

(22) Filed: Jan. 19, 2017

(65) Prior Publication Data

US 2017/0229963 A1   Aug. 10, 2017

(30) Foreign Application Priority Data

Feb. 5, 2016   (CN) .......................... 2016 1 0083739

(51) Int. Cl.
   *H02M 3/158*   (2006.01)
   *H01F 27/24*   (2006.01)
   (Continued)

(52) U.S. Cl.
   CPC ........ *H02M 3/158* (2013.01); *H01F 17/0013* (2013.01); *H01F 27/24* (2013.01);
   (Continued)

(58) Field of Classification Search
   USPC ....................................................... 361/270
   See application file for complete search history.

(56) References Cited

U.S. PATENT DOCUMENTS

| 8,283,789 B2 | 10/2012 | Zeng et al. |
| 2009/0175014 A1* | 7/2009 | Zeng ....................... H01F 27/29 361/782 |

(Continued)

FOREIGN PATENT DOCUMENTS

| CN | 1525631 A | 9/2004 |
| CN | 101009970 A | 8/2007 |

(Continued)

OTHER PUBLICATIONS

The CN1OA issued by CNIPA dated Nov. 5, 2018.

*Primary Examiner* — Danny Nguyen
(74) *Attorney, Agent, or Firm* — Yunling Ren

(57) ABSTRACT

A power supply converter and a method for manufacturing the same are provided. The power supply converter includes an inductance component and a power component, wherein the inductance component includes: a first magnetic substrate, provided with a first via, the first magnetic substrate including a first surface and a second surface, and a first pin being provided on the first surface; a second magnetic substrate, provided with a second via, and having a second surface provided with a second pin; an inductance coil, provided between the first surface and the second surface and having a first end and a second end formed at the vias and connected to the first and second pin, respectively; and a filling part, at least partly filling the vias, wherein the power component and the inductance component are stacked, are in contact and are coupled to each other.

22 Claims, 51 Drawing Sheets

(51) Int. Cl.

| | | |
|---|---|---|
| *H01F 27/28* | (2006.01) | |
| *H03H 1/00* | (2006.01) | |
| *H03H 3/00* | (2006.01) | |
| *H05K 1/02* | (2006.01) | |
| *H05K 1/11* | (2006.01) | |
| *H05K 1/16* | (2006.01) | |
| *H05K 1/18* | (2006.01) | |
| *H05K 3/30* | (2006.01) | |
| *H05K 3/40* | (2006.01) | |
| *H01F 17/00* | (2006.01) | |

(52) U.S. Cl.
 CPC ........... *H01F 27/2804* (2013.01); *H03H 1/00* (2013.01); *H03H 1/0007* (2013.01); *H03H 3/00* (2013.01); *H05K 1/0231* (2013.01); *H05K 1/0233* (2013.01); *H05K 1/115* (2013.01); *H05K 1/165* (2013.01); *H05K 1/181* (2013.01); *H05K 3/303* (2013.01); *H05K 3/4038* (2013.01); *H01F 2017/002* (2013.01); *H01F 2017/0026* (2013.01); *H03H 2001/0014* (2013.01); *H03H 2001/0057* (2013.01); *H03H 2001/0078* (2013.01)

(56) References Cited

U.S. PATENT DOCUMENTS

| | | |
|---|---|---|
| 2014/0176286 A1 | 6/2014 | Okada et al. |
| 2018/0097438 A1* | 4/2018 | Iijima .................. H02M 3/155 |

FOREIGN PATENT DOCUMENTS

| | | |
|---|---|---|
| CN | 101064208 A | 10/2007 |
| CN | 101110293 A | 1/2008 |
| CN | 101241795 A | 8/2008 |
| CN | 101266868 A | 9/2008 |
| CN | 101341807 A | 1/2009 |
| CN | 101354947 A | 1/2009 |
| CN | 102005279 A | 4/2011 |
| CN | 102263495 A | 11/2011 |
| CN | 102867615 A | 1/2013 |
| CN | 103443879 A | 12/2013 |
| CN | 103765533 A | 4/2014 |
| CN | 104039093 A | 9/2014 |
| CN | 104051145 A | 9/2014 |
| CN | 104603889 A | 5/2015 |
| JP | 4202902 B2 | 12/2008 |
| TW | I384739 B | 2/2013 |

* cited by examiner

US 10,389,241 B2

POWER SUPPLY CONVERTER AND METHOD FOR MANUFACTURING THE SAME

CROSS REFERENCE

This application is based upon and claims priority to Chinese Patent Application No. 201610083739.2, filed on Feb. 5, 2016, the entire contents thereof are incorporated herein by reference.

TECHNICAL FIELD

The present disclosure relates to the field of power electronic technology, and more particularly, to a power supply converter and a method for manufacturing the same.

BACKGROUND

With rapid development of mobile communication, a personal mobile terminal has become an important node in information transmission network. People maintain real-time information exchange between the personal mobile terminal and an information center. Meanwhile, improvement of living standards not only meets people's daily basic necessities of life, but also makes people have more and more opportunities to focus on their own health needs. Therefore, a series of wearable devices have emerged at the right moment.

Two important features that all the above devices have are easy mobility and long battery life. Aiming at demands of such products, to design a power supply system with compact volume and high conversion efficiency will facilitate the system to satisfy the two features.

In a switching power supply conversion scheme, there are usually a magnetic element for storing energy, several capacitive elements for filtering, and several switching elements for chopping wave. Because of existence of these elements, it is difficult to design the switching power supply conversion scheme on one silicon wafer similar to a linear regulator to achieve a high integration degree of all functions.

This section provides background information related to the present disclosure which is not necessarily prior art.

SUMMARY

According to a first aspect of the present disclosure, there is provided a power supply converter, including an inductance component and a power component, wherein the inductance component includes:

a first magnetic substrate, provided with a first via, the first magnetic substrate including a first surface and a second surface, and a first pin being provided on the first surface;

a second magnetic substrate, provided with a second via, and having a first surface provided with a second pin and a second surface opposite to the second surface of the first magnetic substrate;

an inductance coil, provided between the first surface of the first magnetic substrate and the first surface of the second magnetic substrate, and having a first end formed at the first via and connected with the first pin, and a second end formed at the second via and connected with the second pin; and a filling part, at least partly filling the first via and the second via, wherein the power component and the inductance component are stacked, and the power component contacts the inductance component and is coupled to the inductance component by the first pin.

According to a second aspect of the present disclosure, there is provided a power supply converter, including an inductance component and a power component, wherein the inductance component includes:

a first magnetic substrate, provided with a first via and a second via, the first magnetic substrate including a first surface and a second surface, and a first pin being provided on the first surface;

a second magnetic substrate;

an inductance coil, provided between the first magnetic substrate and the second magnetic substrate, and having a first end formed at the first via and connected with the first pin, and a second end formed at the second via and connected with the second pin; and a filling part, at least partly filling the first via and the second via, wherein the power component and the inductance component are stacked, and the power component contacts the inductance component and is coupled to the inductance component by the first pin.

According to a third aspect of the present disclosure, there is provided a power supply converter, including an inductance component and a power component, wherein the inductance component includes:

a pre-sintered magnetic substrate, provided with a via, the first magnetic substrate including a first surface and a second surface, and a first pin being provided on the first surface; and an inductance coil, formed at the via and connected with the first pin and the second pin respectively, wherein the power component and the inductance component are stacked, and the power component contacts the inductance component and is coupled to the inductance component by the first pin.

According to a fourth aspect of the present disclosure, there is provided a method for manufacturing a structure of a power supply converter, including manufacturing an inductance component and providing a power component, wherein the manufacturing an inductance component includes:

providing a pre-sintered first magnetic substrate having a first surface and a second surface, providing a first via in the first magnetic substrate, and forming a first pin on the first surface of the first magnetic substrate;

providing a pre-sintered second magnetic substrate having a first surface and a second surface, providing a second via in the second magnetic substrate, and forming a second pin on the first surface of the second magnetic substrate;

forming an inductance coil between the first magnetic substrate and the second magnetic substrate, a first end of the inductance coil being formed at the first via and connected with the first pin, and a second end of the inductance coil being formed at the second via and connected with the second pin;

forming a filling part, for filling the first via and the second via; and stacking the power component and the inductance component, the power component contacting the inductance component and being coupled to the inductance component by the first pin.

According to a fifth aspect of the present disclosure, there is provided a method for manufacturing a power supply converter structure, including manufacturing an inductance component and providing a power component, wherein the manufacturing an inductance component includes:

providing a pre-sintered magnetic substrate having a first surface and a second surface, providing a first via in the magnetic substrate, and forming a first pin is the first surface and a second pin on the second surface;

forming an inductance coil at the first via, a first end of the inductance coil being connected with the first pin, and a second end of the inductance coil being connected with the second pin; and stacking the power component and the inductance component, the power component contacting the inductance component and being coupled to the inductance component by the first pin.

This section provides a summary of various implementations or examples of the technology described in the disclosure, and is not a comprehensive disclosure of the full scope or all features of the disclosed technology.

BRIEF DESCRIPTION OF THE DRAWINGS

The exemplary implementations of the disclosure will be described in detail with reference to the accompanying drawings, through which the above and other features and advantages of the disclosure will become more apparent.

DETAILED DESCRIPTION

Figure 1:
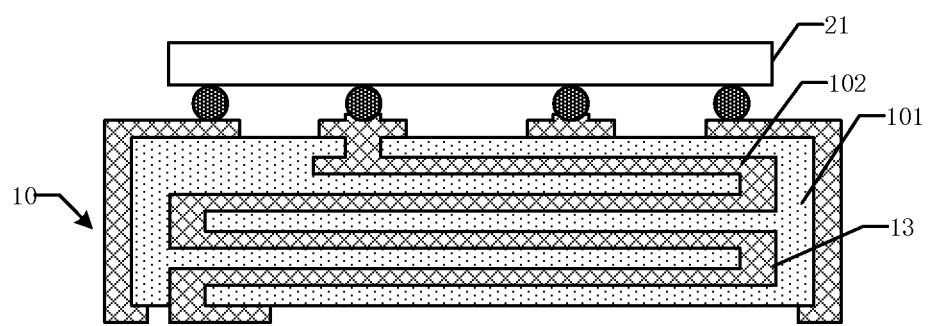
FIG. 1 is a side sectional structural schematic diagram of a power supply converter according to an exemplary implementation of the present disclosure.

Exemplary implementations will now be described more fully with reference to the accompanying drawings. However, the exemplary implementations may be implemented in various forms and should not be understood as being limited to the implementations set forth herein; rather, these implementations are provided so that this disclosure will be thorough and complete, and the conception of exemplary implementations will be fully conveyed to those skilled in the art. In the drawings, the same reference numerals denote the same or similar structures, thus their detailed description will be omitted.

In addition, the described features, structures, or characteristics may be combined in one or more embodiments in any suitable manner. In the following description, numerous specific details are provided so as to allow a full understanding of the embodiments of the present disclosure. However, those skilled in the art will recognize that the technical solutions of the present disclosure may be implemented without one or more of the specific details, or other structures, parts, steps, methods and so on may be used. In other cases, well-known structures, parts or operations are not shown or described in detail to avoid obscuring various aspects of the present disclosure.

In order to provide a power supply converter with high power density and high conversion efficiency, a power component 21 may be placed above an inductance component 10, as shown in FIG. 1, and the inductance component may be made by a low temperature Co-fired ceramic (LTCC) process. Because a magnetic substrate 101 of the inductance component 10 needs to be sintered and formed after a plurality of layers are stacked and molded, choices of both metallic material of the inductance coil 102 of the inductance component 10 and magnetic material of the magnetic substrate 101 are limited, resulting in that material with the most excellent performance cannot be freely chosen. For this reason, the inductance coil 102 of the inductance component 10 generally includes very thin metal layers and a large number of turns, which is not suitable for large current applications that are increasingly demanded. A more reasonable structure is needed to reduce parasitic parameter, improve switching frequency, and shorten a loop length from power supply output to a load chip, so as to adapt to large current applications.

Figure 2:
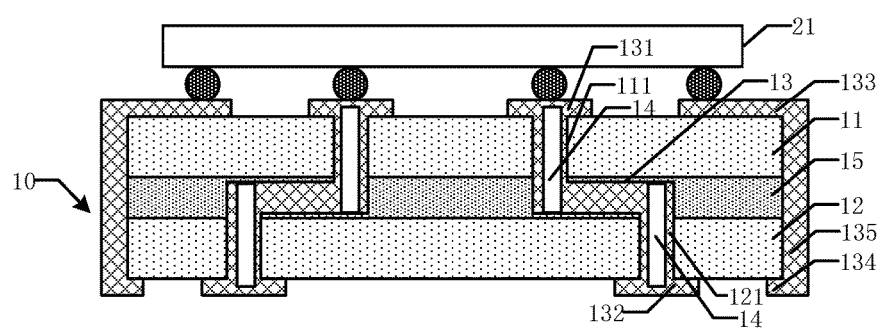
FIG. 2 is a side sectional structural schematic diagram of a power supply converter according to an exemplary implementation of the present disclosure.

Referring to FIG. 2, a power supply converter is firstly provided according to an exemplary implementation of the present disclosure. The power supply converter mainly includes an inductance component 10 and a power component 21. In the present embodiment, the inductance component 10 mainly includes a first magnetic substrate 11, a second magnetic substrate 12, an inductance coil 13 and a filling part 14. The first magnetic substrate 11 has a first surface and a second surface (for example, an upper surface and a lower surface of the first magnetic substrate 11 in FIG. 2), and the first surface of the first magnetic substrate 11 is provided with a first pin 131. Besides, the first magnetic substrate 11 is provided with a first via 111. The first via 111 is not limited to a through hole, but may also be other different forms, such as a blind hole, and a half blind hole and so on. The second magnetic substrate 12 has a first surface and a second surface (for example, a lower surface and an upper surface of the second magnetic substrate 12 in FIG. 2), and the first surface of the second magnetic substrate 12 is provided with a second pin 132. Besides, the second magnetic substrate 12 is provided with a second via 121. The first magnetic substrate 11 and the second magnetic substrate 12 are disposed face to face. For example, the second surface of the first magnetic substrate 11 is opposite to the second surface of the second magnetic substrate 12. The inductance coil 13 is provided between the first surface of the first magnetic substrate 11 and the first surface of the second magnetic substrate 12. According to one embodiment, the inductance coil 13 may be provided in the first magnetic substrate 11 and/or the second magnetic substrate 12. In addition, a first end of the inductance coil 13 is formed at the first via 111 and connected to the first pin 131, for example, by covering copper on a surface of the first via 111 or filling conductor in the first via 111 and so on. The present disclosure is not limited to this. A second end of the inductance coil 13 is formed at the second via 121 and connected with the second pin 132, for example, by covering copper on a surface of the second via 121 or filling conductor in the second via 121 and so on. All the surfaces may be plane surfaces. The present disclosure is not limited to this. In FIG. 2, the filling part 14 which forms the first end and the second end at least partly fills the first via 111 and/or the second via 121. The present disclosure is not limited to this. The power component 21 may be integrated in one IPM module. The power component 21 and the inductance component 10 are stacked, and the power component 21 contacts the inductance component 10 and is coupled to the inductance component 10 by the first pin 131. The pins described above or below may be in the form of pads, the present disclosure is not limited to this.

In the above power supply converter, the first magnetic substrate 11 and the second magnetic substrate 12 in the inductance component 10 may be, for example, pre-sintered magnetic components, that means, the magnetic substrate could be sintered and be cooled before further manufacturing. Therefore, suitable magnetic material, for example, copper, and suitable combination manners may be freely chosen, to achieve excellent magnetic performance. Meanwhile, the above first via 111 and the second via 121 may facilitate to a large current requirement design. Besides, in the above power supply converter, pins (for example, the first pin 131 and the second pin 132) may be mechanically fixed almost without wasting any space, and the power component 21 and the inductance component 10 may be stacked to improve space utilization rate of the overall structure. Thus, the power supply converter according to exemplary implementations of the present disclosure may achieve high efficiency and high power density very easily and is applicable for large current applications. For example, in the present exemplary embodiment, because the space utilization rate is extremely high, the power supply converter is suitable for extremely high frequency applications. For example, operating frequency may be larger than or equal to 3 MHz, such as, 3 MHz, or even 5 MHz, 10 MHz or above. For example, the power supply converter is suitable for low voltage and large current output, and the output voltage is, for example, equal to or smaller than 2.5V. For example, overall height of the power supply converter is extremely thin, and the overall height is, for example, equal to or smaller than 2 mm or even 1 mm. For example, the power supply converter may achieve extremely high power density easily. The power density may be, for example, larger than 2000 W/inch$^3$, even 3000 W/inch$^3$. In addition, the power supply converter according to the present exemplary implementation is suitable for integration of multi-channel power supply converters (referring to embodiments described later). For example, the multi-channel power supply converters are connected in parallel to form one channel large current output, or the multi-channel power supply converters are combined to form multi-channel outputs, or the like.

Continuing to refer to FIG. 2, in the present exemplary embodiment, the first via 111, the second via 112 and the inductance coil 13 may form an inductance winding combination. The number of the inductance winding combination may be one or more depending on actual needs. The number of the inductance coil may also be one or more. A plurality of first vias 111 and/or second vias 121 may be correspondingly provided for a plurality of inductance coils respectively. The plurality of inductance coils may also be jointly connected to one first via 111 and/or one second via 112. In addition, a structure of the power supply converter provided according to the present exemplary embodiment may further include a third pin 133, a fourth pin 134 and a leading wire 135. In the present embodiment, the third pin 133 is provided on the first surface of the first magnetic substrate 11 and is coupled to the power component 21. The fourth pin 134 is provided on the first surface of the second magnetic substrate 12. The leading wire 135 may be provided along an outer side of the inductance component 10 and may connect the third pin 133 and the fourth pin 134. Depending on actual needs, the third pin 133, the fourth pin 134 and the leading wire 135 may be an integrated structure, and the power supply converter may have at least one set of the integrated structure. Hereinafter, respective parts of the power supply converter will be described in further detail by a specific example.

Figure 3:
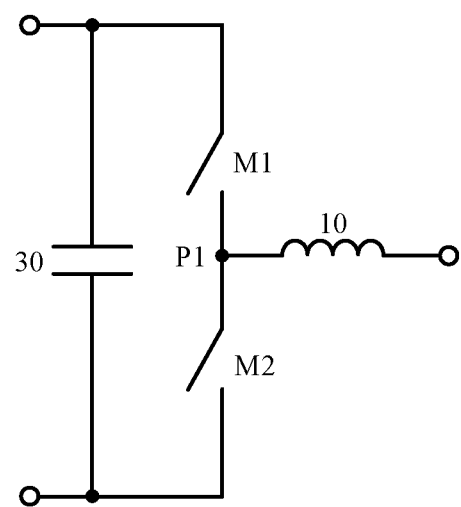
FIG. 3 is a circuit schematic diagram of a power supply converter according to an exemplary implementation of the present disclosure.
Figure 4A:
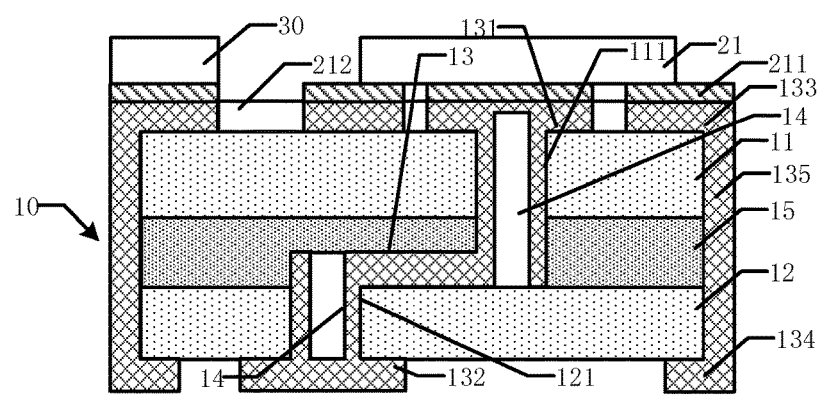
FIG. 4A is a side sectional schematic diagram of a power supply converter according to an exemplary implementation of the present disclosure.

Taking FIG. 3 for example, the power supply converter may be applied in a buck conversion circuit or a boost conversion circuit. The power supply converter may contain a transistor, an inductor and a capacitor (based on different circuit topologies, the number of transistors may be different, not limited to two as shown in FIG. 3). The inductance component 10 and a current path output to the load may have the largest current in the circuit. FIG. 4A is a side sectional schematic diagram corresponding to an actual structure of the power supply converter in FIG. 3. The power supply converter mainly includes: a power component 21 which contains a half-bridge arm formed by a transistor M1 and a transistor M2 in FIG. 3; an inductor component 10, a network node P1 (i.e., a first pin 131 in FIG. 4A) of the power supply converter, which is mainly used for connecting a midpoint of the transistor M1 and the transistor M2 in the power component 21 (i.e., a midpoint of the half-bridge arm) and the inductance component 10; the power component 21 may be electrically connected to the first pin 131 through a solder layer 211; a soldering resist insulating layer 212 located between adjacent solder layers 211; a fourth pin 134; a third pin 133; a capacitor 30; a first magnetic substrate 11 and a second magnetic substrate 12, wherein a second conductor part of the inductance coil 13 of the inductance component 10 may be attached between the second magnetic substrate 12 and the first magnetic substrate 11, for example, by forming at least one layer of coil by a copper wire, a copper foil or trace of a circuit board, and a first conductor part and a second conductor part of the inductance coil 13 of the inductance component 10 may be respectively formed at the first via 111 and the second via 121, for example, by covering copper or filling conductor or the like, but the present disclosure is not limited to this; a filling layer 15 located between the first magnetic substrate 11 and the second magnetic substrate 12, which may be formed by permeability magnetic material or non-permeability magnetic material. The filling layer 15 may be filled by air or other gas. The specific choice may depend on inductance value needed by the circuit as shown in FIG. 3. The present disclosure is not limited to this. Besides, if the filling layer 15 if formed by an adhesive material, the first magnetic substrate 11 and the second magnetic substrate 12 may be bonded by the filling layer 15. Output terminals of the inductance component 10 may be located on the lower surface of the second magnetic substrate 12 or the upper surface of the first magnetic substrate 11, depending on an implementation manner of the output pins. In the present implementation, the output terminals are located at the lower surface of the second magnetic substrate 12. One power supply converter is shown in FIG. 3. If there are a plurality of power supply converters, there may be a plurality of input terminals or output terminals correspondingly. A plurality of input terminals or output terminals may be connected in parallel, or not in parallel.

In addition, in FIG. 4A, the first via and the second via may be offset from each other. However, the first via and the second via may also be directly facing. The present disclosure is not limited to this. It should be noted that, even if the first via and the second via are directly facing, the inductance coil 13 located between the first magnetic substrate 11 and the second magnetic substrate 12 may still have various shapes, which is not limited to whether the first via and the second via are directly facing. Besides, for example, referring to FIG. 4B, in other exemplary embodiments of the present disclosure, the first via 111 shown in FIG. 4A may be designed as a form of 111' shown in FIG. 4B, while the second via 121 may be designed as a form of 121' shown in FIG. 4B. At this time, the first magnetic substrate 11 and the second magnetic substrate 12 may have two or more vias. The second conductor part of the inductance coil 13 of the inductance component 10 may be freely chosen to be electrically connected to upper surface of the first magnetic substrate 11 and/or the lower surface of the second magnetic substrate 12. In one embodiment, designs of FIGS. 4A and 4B may be combined, to employ a combination of direct facing through hole and a staggered half through hole or the like, but the present disclosure is not limited to this.

Figure 5:
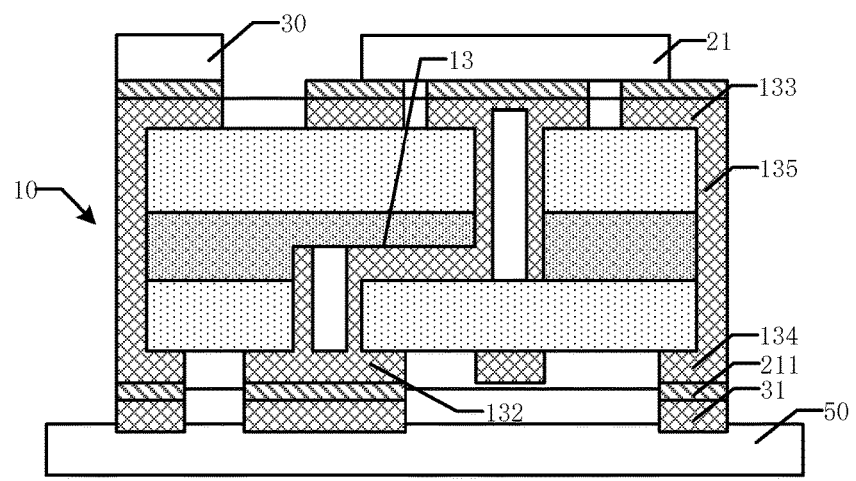
FIG. 5 is a schematic diagram illustrating a manner for providing pins of a power supply converter according to an exemplary implementation of the present disclosure.

In the present exemplary implementation, pins of the power supply converter may be provided on the upper surface of the first magnetic substrate 11 and the lower surface of the second magnetic substrate 12. For example, referring to FIG. 5, the third pin 133 is formed on the upper surface of the first magnetic substrate 11, and the fourth pin 134 is formed on the lower surface of the second magnetic substrate 12. The leading wire 135 connects the third pin 133 and the fourth pin 134. The solder layer 21 is used for electrically connecting the power component 21 and a first carrier plate 50. A power supply or control signal may be electrically connected to the power supply converter by the leading wire 135 provided outside the inductance component. The first pin 131 and the second pin 132 may also be used for electrical connection of the power supply converter, but the present disclosure is not limited to this. The first carrier plate 50 carries the power supply converter, and establishes electrical connections between input signals, output signals of the power supply converter and other functional modules on the first carrier plate 50.

FIGS. 6A-6I illustrates implementations of inductance windings of the power supply converter according to the present exemplary implementation.

Figure 6A:
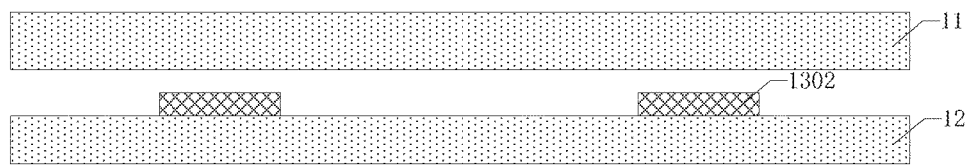
FIGS. 6A-6I are schematic diagrams illustrating a manufacture process of a power supply converter according to an exemplary implementation of the present disclosure.

As shown in FIG. 6A, a first magnetic substrate 11 and a second magnetic substrate 12 are provided, and a second conductor part 1302 may be disposed between the first magnetic substrate 11 and the second magnetic substrate 12. In the present embodiment, the second conductor part 1302 may conform to design requirements of the inductance component 10 shown in FIG. 3. Various methods may be adopted to place the second conductor part 1302 between the first magnetic substrate 11 and the second magnetic substrate 12, for example, by prefabricating a copper layer, electroplating and printing.

Figure 6B:
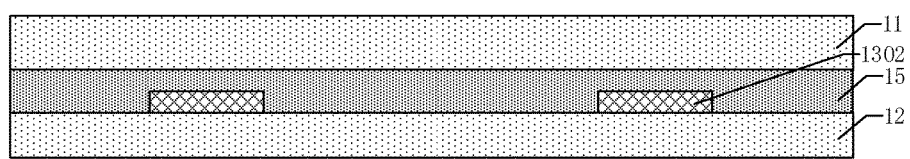

As shown in FIG. 6B, a filling layer 15 is formed between the first magnetic substrate 11 and the second magnetic substrate 12. The filling layer 15 may be non-permeability magnetic material or permeability magnetic material. Material and thickness of the filling layer 15 may depend on inductance value of the inductance component 10 in FIG. 3. In the present exemplary implementation, a filling layer 15 with adhesive force may be adopted, and first magnetic substrate 11 is disposed on the filling layer 15. The first magnetic substrate 11 and the second magnetic substrate 12 may be bonded by the filling layer 15.

Figure 6C:
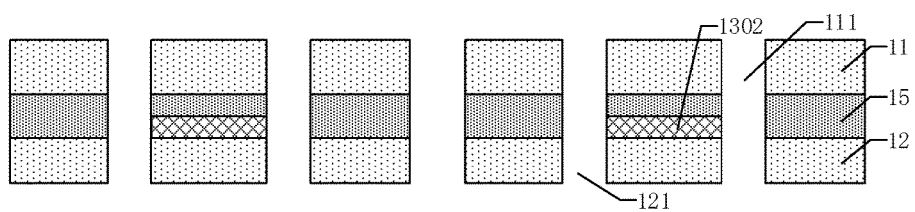

As shown in FIG. 6C, a via (for example, the above first via 111 and the second via 121) is formed at locations where electrical connection needs to be established. At this time, since the first magnetic substrate 11 and the second magnetic substrate 12 are pre-sintered, actions, such as punching, will be easily implemented. The via may be not limited to a through hole, but may also be a half through hole, a blind hole or the like, but the present invention is not limited to this.

Figure 6D:
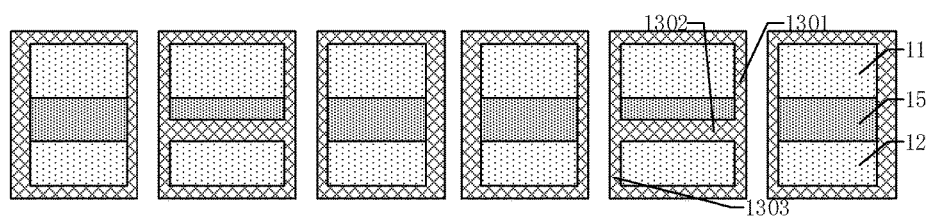

As shown in FIG. 6D, wall of the via, the upper surface of the first magnetic substrate 11 and the lower surface of the second magnetic substrate 12 are electroplated, to form a conductive wall. In the present exemplary implementation, a first conductor part 1301 may be, for example, a conductive layer formed on the wall of the first via 111, and a third conductor part 1303 may be, for example, a conductive layer formed on the wall of the second via 121, but the present disclosure is not limited to this.

Figure 6E:
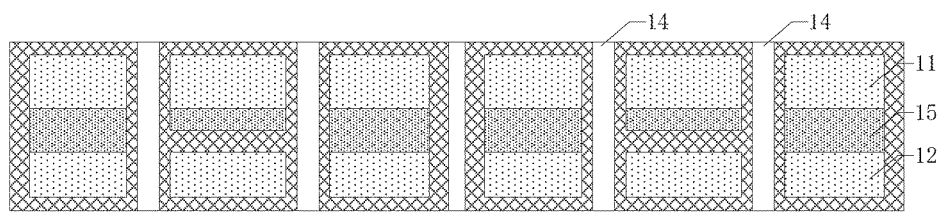

As shown in FIG. 6E, each via is filled, to obtain a filling part 14. The filling part 14 may adopt non-conductive material, such as resin, or may adopt conductive material, such as copper paste, silver paste or the like. The filling part 14 adopting conductive material may further improve conductivity of the via.

Figure 6F:
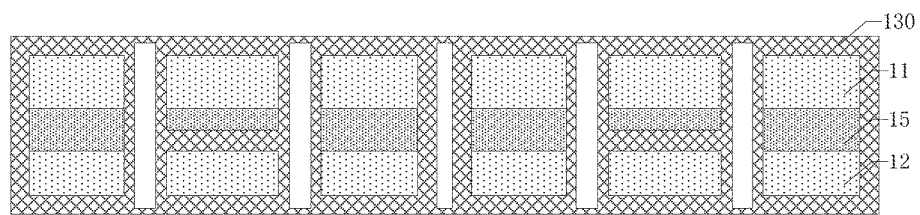

As shown in FIG. 6F, the upper surface of the first magnetic substrate 11, the lower surface of the second magnetic substrate 12 and a surface of the filling part 14 are electroplated, to obtain a circuit layer 130 used for forming pins.

Figure 6G:
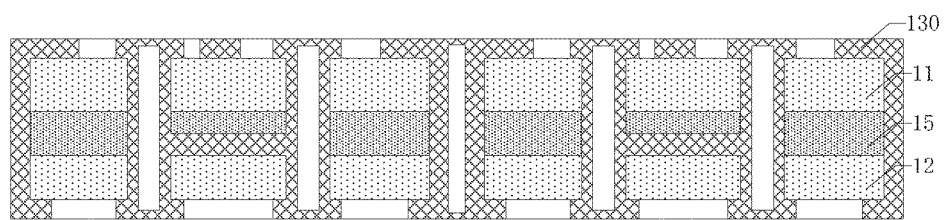

As shown in FIG. 6G, depending on needs of circuit connection, the circuit layer 130 used for forming pins is etched, to form respective pin patterns as shown in the figures. Besides, an insulating layer is formed on the upper surface of the first magnetic substrate 11, a lower surface of the second magnetic substrate 12, and the circuit layer that needs to be insulated. If the circuit layer under the lower surface of the second magnetic substrate 12 is not required, relevant material may be employed to cover the lower surface of the second magnetic substrate to prevent it from being plated with conductive material at the time of electroplating.

Figure 6H:
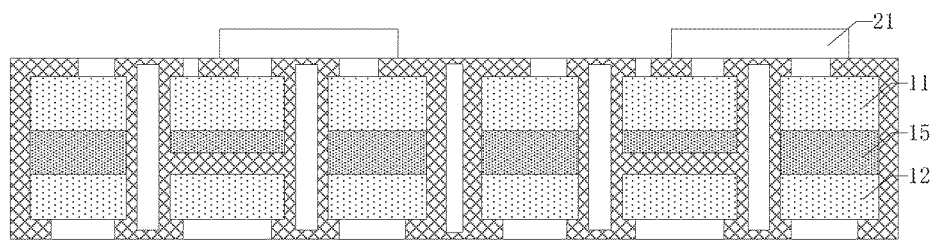

As shown in FIG. 6H, components, e.g., the power component 21 or the like may be mounted in corresponding positions of the circuit layer which is on a superficial layer of the inductance component 10.

Figure 6I:
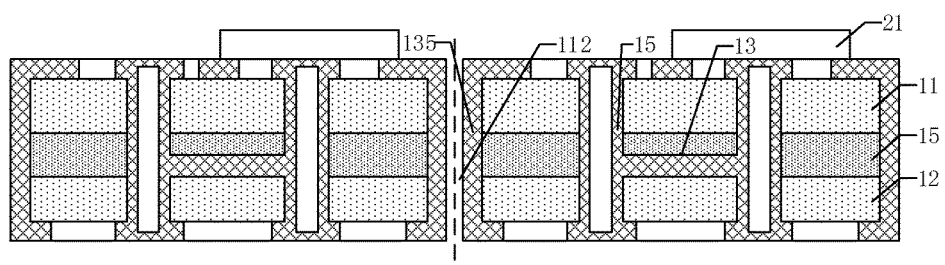

As shown in FIG. 6I, the composite substrate as shown in FIG. 6H is diced to obtain a plurality of power supply converter structures. For example, the number of the inductance components is at least two (there are two inductance components in FIG. 6I), and a through hole 112 is provided in the first magnetic substrate 11 and the second magnetic substrate 12 and between the two inductance components. Conductive material, e.g., copper, is formed on the wall of the through hole 112. When the first magnetic substrate 11 and the second magnetic substrate 12 are diced along the through hole 112 to obtain a plurality of the inductance components (two inductance components may be obtained after being diced in FIG. 6I). The diced through hole 112 forms a leading wire 135 provided along an outer side of the inductance component. This method is suitable for mass production. The diced power supply converter structure in FIG. 6I may be the power supply converter structure shown in FIG. 4B.

Figure 7:
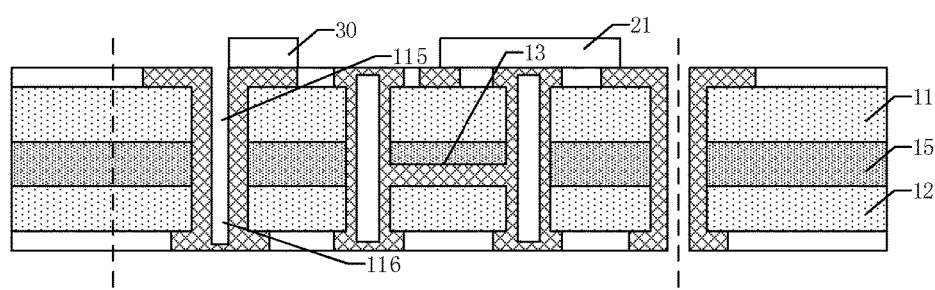
FIG. 7 is a schematic diagram illustrating the dicing of a composite magnetic substrate according to an exemplary implementation of the present disclosure.
Figure 8:
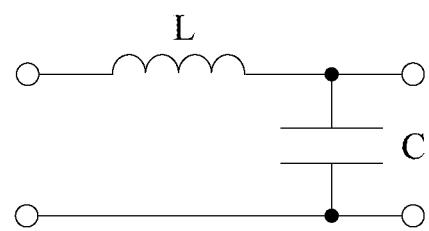
FIG. 8 is an input section circuit schematic diagram of a power supply converter according to an exemplary implementation of the present disclosure.

Besides employing the manner as shown in FIG. 6I that the composite magnetic substrate is diced to obtain the power supply converter structure, a manner as shown in FIG. 7 may also be employed to dice the composite magnetic substrate. In FIG. 7, a plurality of third vias 115 are provided in the first magnetic substrate 11, and a plurality of fourth vias 116 are provided in the second magnetic substrate 12. Conductive material, such as copper, is formed on walls of the third vias 115 and the fourth vias 116. When the power supply converter is not diced along the third vias 115 and the fourth vias 116, since the third vias 115 and the fourth vias 116 are surrounded by the first magnetic substrate 11 and the second magnetic substrate 12, it may be equivalent to a filter inductor L when input current flows through the third vias 115 and the fourth vias 116, and thus an LC filter as shown in FIG. 8 may be formed with the capacitor 30 at an input end. For example, as shown in FIG. 7, third vias 115 may be provided in the first magnetic substrate 11, and fourth vias 116 may be provided in the second magnetic substrate 12. A filter inductor L is provided between the first magnetic substrate 11 and the second magnetic substrate 12. A first end of the filter inductance L is formed at the third vias 115, and a second end of the filter inductance L is formed at the fourth vias 116, but the present disclosure is not limited to this. For example, third vias and fourth vias may be provided in the first magnetic substrate 11. A filter inductor L is provided between the first magnetic substrate 11 and the second magnetic substrate 12. A first end of the filter inductance L is formed at the third vias of the first magnetic substrate 11, and a second end of the filter inductance L is formed at the fourth vias of the first magnetic substrate 11, the present disclosure is not limited to the manner as illustrated in the present exemplary implementation. An LC filter may also be formed at an output end or other locations of the circuit. The capacitor 30 is not limited to be connected to the input end, and the present disclosure is not limited to this. The material and the structure of the filter inductor L may be similar to design of other inductance components 10. The formed LC filter may connect with other connection points by traces or fly lines or the like. The LC filter may inhibit high frequency switching current generated by the switching devices, and reduce electromagnetic interference on peripheral circuit by the power supply converter.

In the above LC filter, the capacitor 30 may be connected to two ends of the half-bridge arm formed by the transistor M1 and the transistor M2 as shown in FIG. 3. The capacitor 30 may be, for example, a Buck input capacitor or a Boost output capacitor or the like, which is not limited to this. The filter inductor L may be connected to the midpoint of the half-bridge arm formed by the transistor M1 and the transistor M2 as shown in FIG. 3.

Depending on different applications, requirements of the inductance value of the inductance component 10 and current capacity of the inductor are different, and thus design methods of the inductance component 10 are also different. For high frequency large current applications, the required inductance value is generally small, and requirement for the current capacity is strong. For low frequency small current applications, the required inductance value is generally large, and requirement for the current capacity is weak. An equivalent sectional area of a magnetic core, magnetic permeability, length of a magnetic path of the inductance component 10 may be adjusted, to obtain different inductance values. A wire length and sectional area of the inductance coil 13 may be adjusted, to obtain different through current capacities. Hereinafter, a method for adjusting parameters of the inductance component 10 of the present exemplary implementation may be described in detail.

Depending on magnitudes of the inductance values and load currents, the inductance coil 13 may be designed in a variety of forms. As for large current and high frequency applications, the required inductance value is small. However, in order to reduce conduction loss of the inductance coil 13 under a large current, the coil may be designed as follows.

Figure 9:
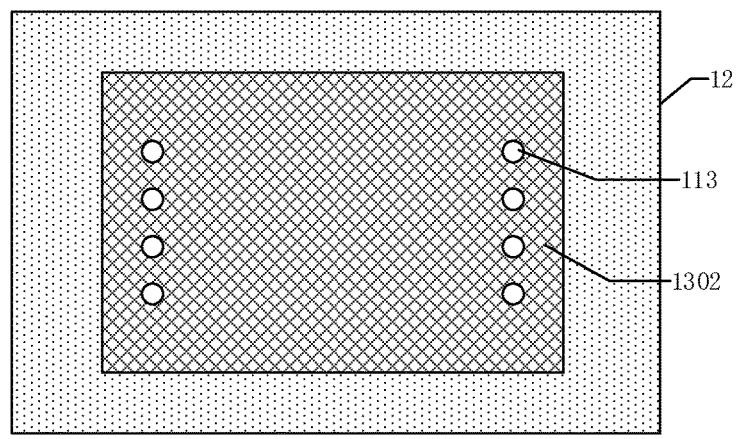
FIG. 9 is a plan structural schematic diagram of a power supply converter according to an exemplary implementation of the present disclosure.

As shown in FIG. 9, a second conductor part 1302 of the inductance coil is formed in the second magnetic substrate 121. The second conductor part 1302 constitutes a part of the inductance coil. As for high frequency and large current applications, one turn of coil may usually meet application requirements of the inductance value. All vias 113 may be used for electrically connecting the power component 21 at the superficial layer and the output pins at the bottom layer, but the present disclosure is not limited to this.

Figure 10:
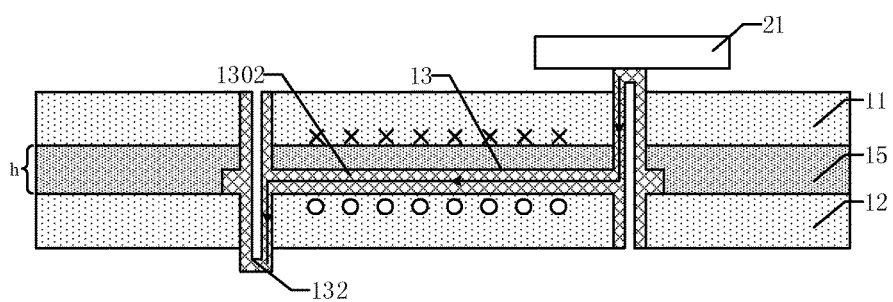
FIG. 10 is a schematic diagram illustrating an induced magnetic field of a power supply converter according to an exemplary implementation of the present disclosure.

As shown in FIG. 10, the output pin, i.e., the second pin 132, is located on the lower surface of the second magnetic substrate 12. The arrow shows a flowing direction of current from the power component 21 to the output pin. When the current flows through the second conductor part 1302 as shown in FIG. 10, magnetic flux as shown in FIG. 10 is generated in the first magnetic substrate 11 and the second magnetic substrate 12, wherein X represents a direction that the magnetic flux is perpendicular into a paper, and a dot represents a direction that the magnetic flux is perpendicular out from a paper. It can be seen that in the present embodiment, magnetic flux directions generated by the current flowing through the second conductor part 1302 are opposite in the first magnetic substrate 11 and the second magnetic substrate 12. FIG. 10 illustrates an inductance component which is suitable for large current and high frequency application environment. However, the present disclosure is not limited to this. For example, the second pin 132 may also be located on the upper surface of the first magnetic substrate 11.

Figure 11A:
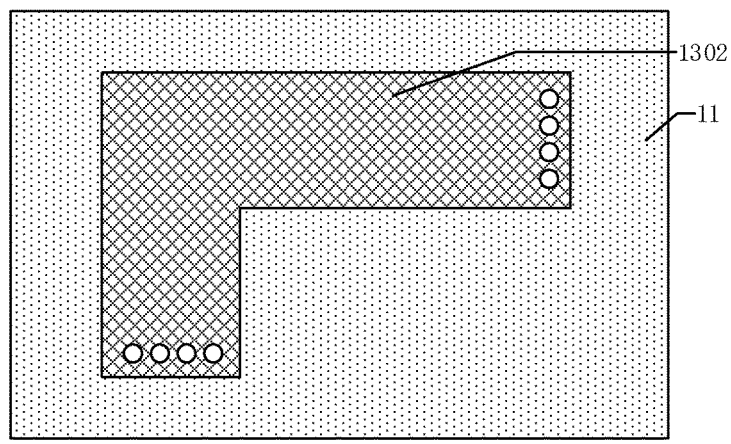
FIGS. 11A-11C are sectional schematic diagrams of an inductance coil according to an exemplary implementation of the present disclosure.
Figure 11B:
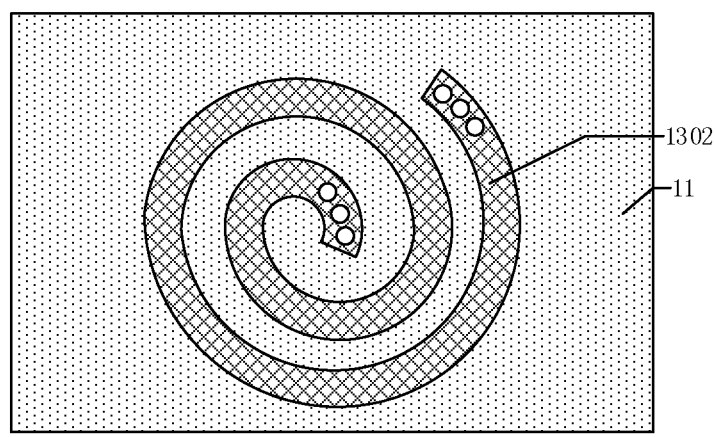
Figure 11C:
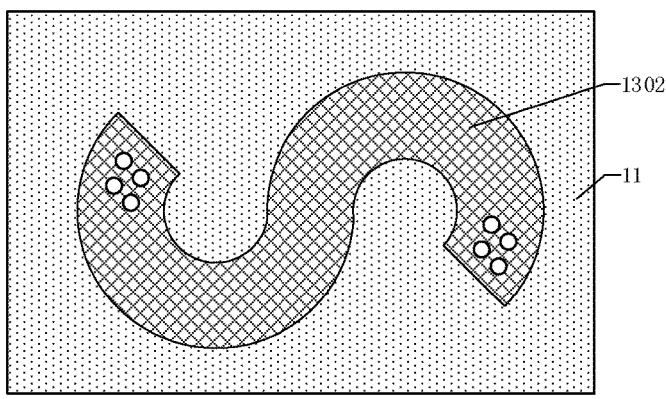

In order to adapt to requirements of different application environments on different inductance values, a shape of the inductance coil may also be designed in a variety of forms, such as forms shown in FIGS. 11A-11C. FIG. 11A is an L-shaped coil design, FIG. 11B is a spiral-shaped coil design which may form a plurality turns of windings, and FIG. 11C is an S-shaped coil design. Those skilled in the art may also design more different shapes depending on actual needs. Different coil lengths correspond to different equivalent sectional areas of the magnetic core as shown in FIG. 10. Due to different lengths and sectional areas of the inductance coil, through flow capacities of respective inductance coils are also different.

In addition, a gap between the first magnetic substrate 11 and the second magnetic substrate 12 may also be adjusted to adjust the inductance value. As shown in FIG. 10, a gap having a height h exists between the first magnetic substrate 11 and the second magnetic substrate 12. The height h of the gap may be adjusted depending on actual requirements on the inductance value. Permeability magnetic material and non-permeability magnetic material may be selected as a filling layer of the gap depending on actual requirements on the inductance value. An inductance value is calculated as follows:

$$L = \frac{n^2}{\frac{l}{\mu_a \mu_o A_e} + \frac{2h}{\mu_b \mu_o A_e}} \quad (1)$$

wherein n is the number of turns of the inductance coils in the inductance component; l is equivalent path length of the inductance coil in the magnetic substrate; h is height of the gap as shown in FIG. 10; $\mu_a$ is relative magnetic permeability of the magnetic substrate; $\mu_b$ is relative magnetic permeability of the gap filling layer 15; $\mu_o$ is permeability of vacuum; and $A_e$ is equivalent magnetic core area.

It can be known from equation (1) that, the inductance value may be adjusted by adjusting magnetic permeability of the gap filling layer 15 and the height h of the gap as shown in FIG. 10. When the magnetic permeability of the gap filling layer 15 increases, the inductance value will also increase accordingly. When the height h of the gap increases, the inductance value will decrease accordingly. In addition, the magnetic permeability of the magnetic substrate may be directly adjusted. When the magnetic permeability of the magnetic substrate increases, the inductance value will also increase accordingly.

Figure 12A:
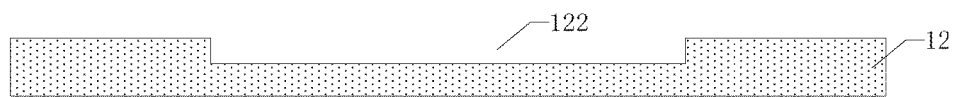
FIGS. 12A-12C are schematic diagrams illustrating a manufacture process of a power supply converter according to an exemplary implementation of the present disclosure.
Figure 12B:
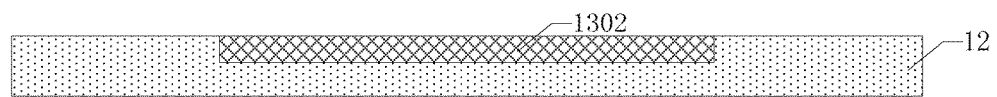
Figure 12C:
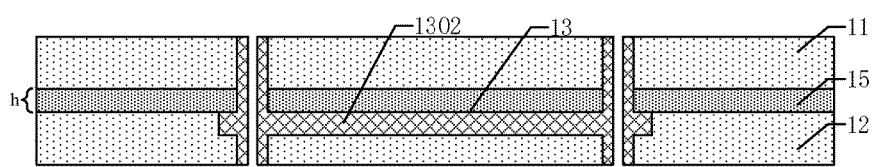

In the structure of FIG. 10, a greater inductance value may also be obtained by adopting other methods. For example, referring to FIG. 12A, a containing groove 122 is provided at a position where the second conductor part 1302 is to be placed on the second magnetic substrate 12. Referring to FIG. 12B, a second conductor part 1302 may be prefabricated or electroplated at the position of the containing groove 122. Referring to FIG. 12C, the first magnetic substrate 11 and the second magnetic substrate 12 are combined together, and then the power supply converter module may be manufactured by subsequent processes. Since the second conductor part 1302 is embedded within the second magnetic substrate 12, the first magnetic substrate 11 may be closely attached on the second magnetic substrate 12. The height h of the gap in FIG. 10 is greatly reduced in FIG. 12C, it can be known from equation (1) that the inductance value of the inductance component 10 may be significantly increased on the premise of other parameters being unchanged.

Figure 13:
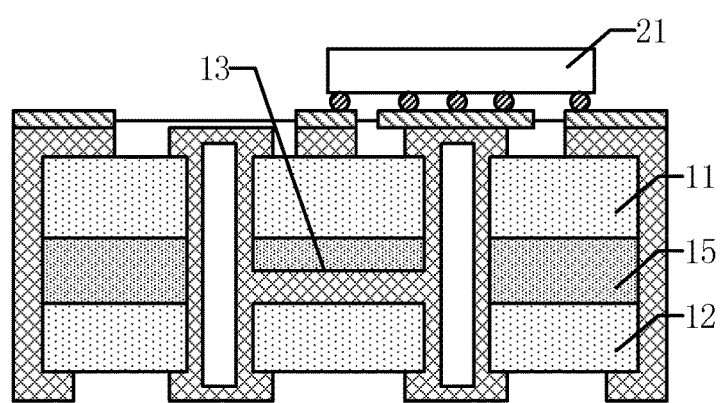
FIG. 13 is a connection schematic diagram of a power component of a power supply converter according to an exemplary implementation of the present disclosure.

After manufacturing the inductance component 10, the power component 21 containing the transistor may be mounted on the inductance component 10 in a various types of package. For example, as shown in FIG. 13, a package of Ball Grid Array (BGA) may be employed. For another example, other types of package, such as, a lead package, a quad flat no-lead (QFN) package or the like may also be employed.

From the power supply converter as shown in FIG. 2, it can be seen that it further includes other devices such as a capacitor 30, besides the inductance component 10 and a switching device. Therefore, a circuit layer 130 at the surface of the first magnetic substrate 11 may be used as a bonding pad or a connecting wire of component mounting, to mount other devices such as a capacitor 30 or the like. For a more complex circuit, a printed circuit board may also be used as a carrier of wirings, to mount the lower surface of the printed wiring board on the inductance component 10, and to mount the above power component 21, the capacitor 30 and other devices on the upper surface of the printed wiring board.

Figure 14A:
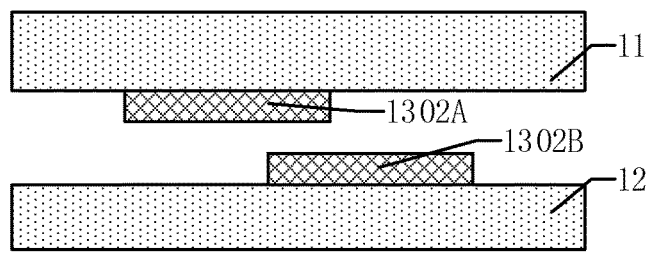
FIGS. 14A-14C are front sectional structural schematic diagrams of a power supply converter according to an exemplary implementation of the present disclosure.
Figure 14B:
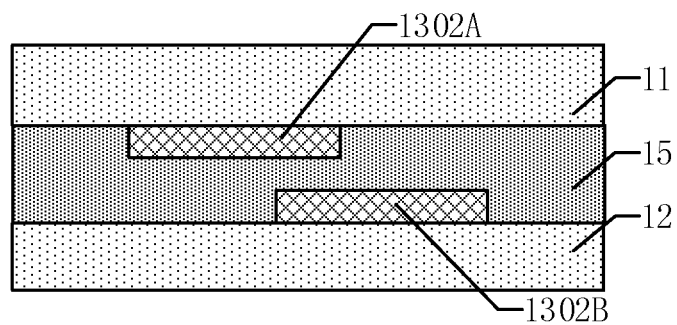
Figure 14C:
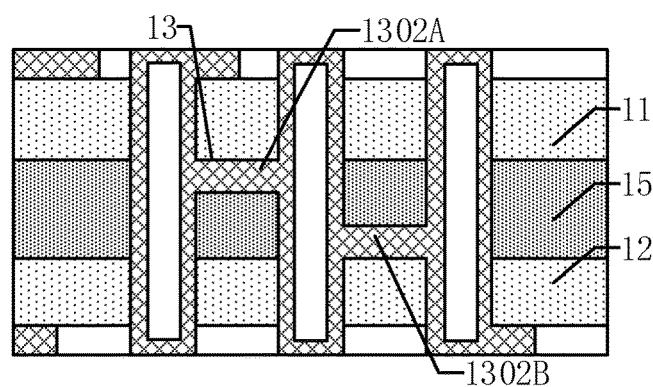

In the present exemplary embodiment, the second conductor part 1302 of the inductance coil 13 may also include a plurality of layers of coils. For example, as shown in FIG. 14A, a first layer of conductor layer 1302A is formed on the lower surface of the first magnetic substrate 11, and a second layer of conductor layer 1302B is formed on the upper surface of the second magnetic substrate 12. As such, an inductance coil 13 including two layers of coils may be obtained. As shown in FIG. 14B, insulating material 15 with adhesive effect may be filled between the first layer of conductor layer 1302A and the second layer of conductor layer 1302B. The first magnetic substrate 11 and the second magnetic substrate 12 are joined together to form a complete functional module. As shown in FIG. 14C, respective layers of conductor layers such as the first layer of conductor layer 1302A and the second layer of conductor layer 1302B may be connected by way of respective vias as illustrated in the drawings.

Figure 15:
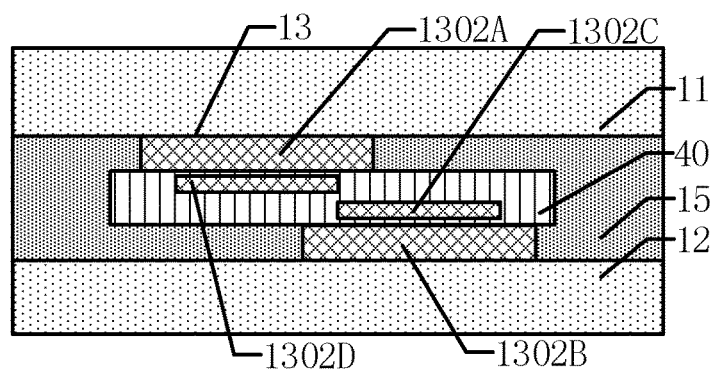
FIG. 15 is a side sectional structural schematic diagram of a power supply converter according to an exemplary implementation of the present disclosure.

Further, as shown in FIG. 15, a plurality of PCB boards 40 may be added between the first magnetic substrate 11 and the second magnetic substrate 13. More layers of the second conductor parts 1302 may be provided on the PCB boards 40. For example, a third layer of conductor layer 1302C and a fourth layer of conductor layer 1302D may be provided, so that the number of layers of the inductance coils of the inductance component 10 may be further increased, but the present disclosure is not limited to this.

A plurality of layers of circuit connections are added between the first magnetic substrate 11 and the second magnetic substrate 12, which expands space utilization rate of the inductance coil 13 in the perpendicular direction, and facilitates the forming of a plurality of turns of coil. The plurality of turns of coil may be connected in series or in parallel. Connections between different conductor layers may be achieved through vias. Meanwhile, this manner does not need to increase the number of the magnetic substrate and complexity of overall processing technology of the power supply converter.

The circuit shown in FIG. 3 is constituted by one stage power supply converter circuit. In other exemplary embodiments of the present disclosure, the power supply converter may also be constituted by a plurality of stages of power supply converter circuits. For example, referring to FIG. 16, a two-stage circuit is provided between the input and the output, each stage circuit structure at least including one inductance component 10 and a group of switching devices. A capacitor 30 is provided at an input end of the circuit, and a bus capacitor is provided between the first stage and the second stage. However, those skilled in the art will readily understand that each stage circuit is not limited to the topology as shown in the drawings. As shown in FIG. 17, a parallel two-stage circuit is provided between the input and the output.

Figure 16:
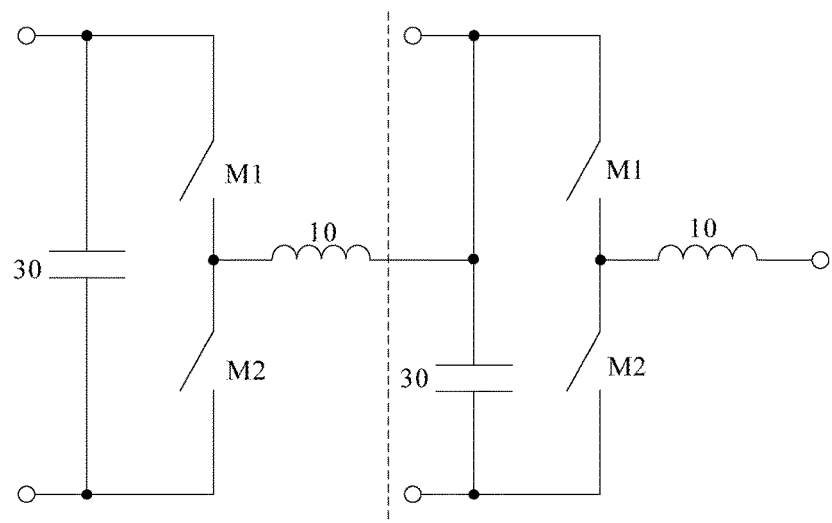
FIG. 16 is a circuit schematic diagram of a power supply converter according to an exemplary implementation of the present disclosure.
Figure 17:
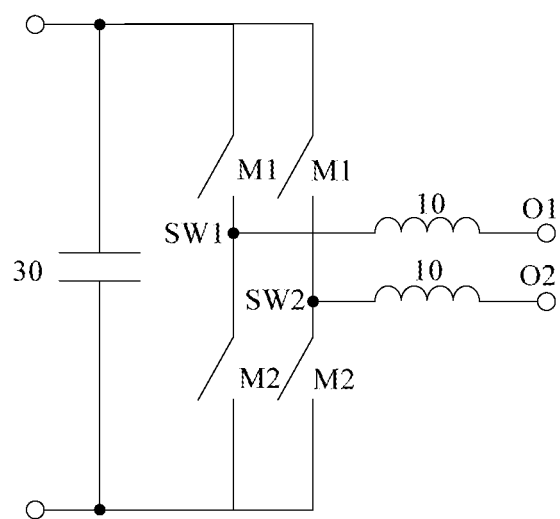
FIG. 17 is a circuit schematic diagram of a power supply converter according to an exemplary implementation of the present disclosure.
Figure 18:
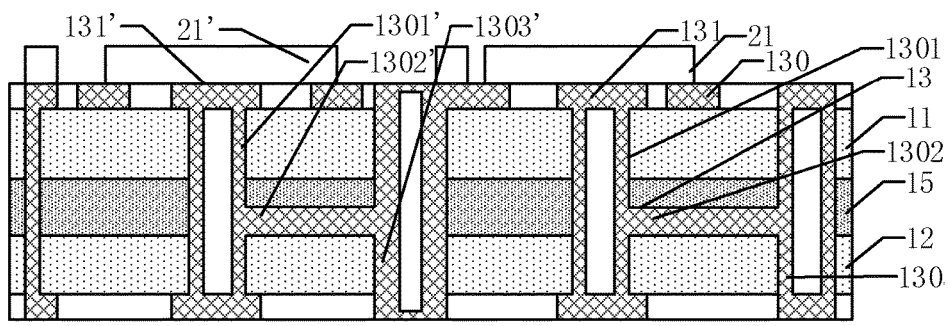
FIG. 18 is a side sectional schematic diagram of an implementation structure of a power supply converter circuit of FIG. 16.

FIG. 18 is a specific implementation structure of the two-stage circuit in FIG. 16. This structure is formed by two cascaded power supply converter modules. In the present embodiment, the inductance coil 13 of the first stage power supply converter module is implemented by a first conductor part 1301, a second conductor part 1302 and a third conductor part 1303. The inductance coil 13 of the first stage power supply converter module is connected to the power component 21 through the first pin 131. The inductance coil of the second stage power supply converter module is implemented by a first conductor part 1301', a second conductor part 1302' and a third conductor part 1303'. The inductance coil of the second stage power supply converter module is connected to the power component 21' through the first pin 131'. The first and second stage power supply converter module may be electrically connected by a circuit on a surface of the module or within the module.

Figure 19:
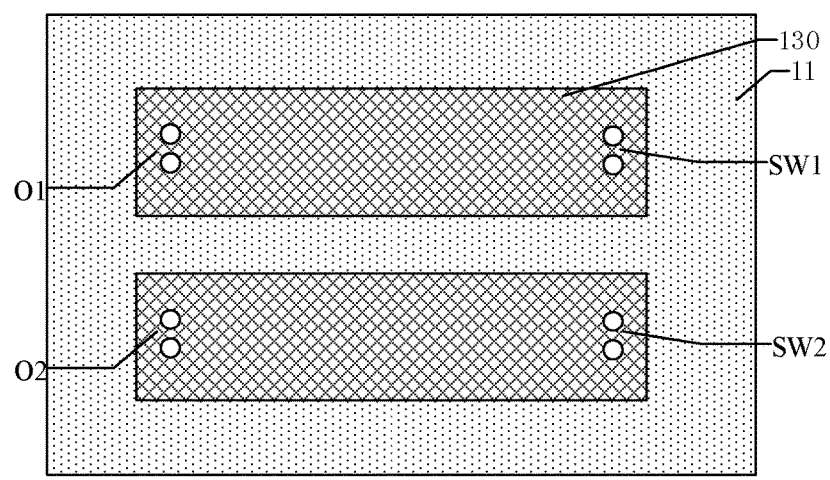
FIG. 19 is a plan structural schematic diagram of a power supply converter circuit of FIG. 17.

FIG. 19 illustrates a top layer of a plan view of the specific implementation structure of the two-stage circuit in FIG. 17. In the present embodiment, the power component 21 has at least two output ends, such as SW1 and SW2. A connection pad of SW1 and SW2 is visible on the circuit layer 130 at the upper surface of the first magnetic substrate 11. A conductive pad of the output ends SW1 and SW2 may be connected to the inductance component 10 through the first pin 131. Output ends of the inductance component 10 are O1 and O2.

Figure 4B:
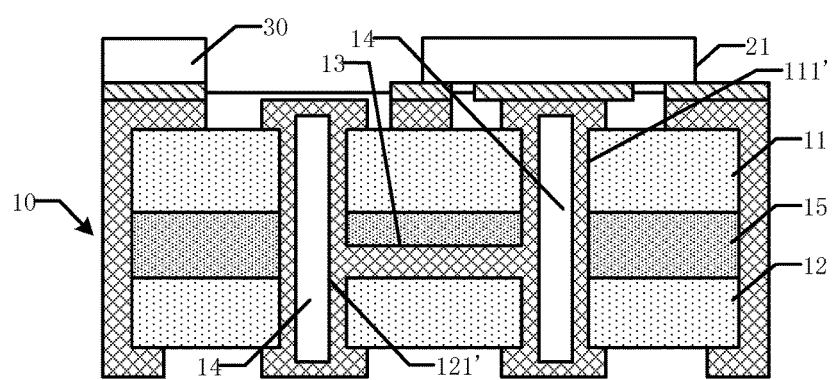
FIG. 4B is a side sectional schematic diagram of a power supply converter according to an exemplary implementation of the present disclosure.
Figure 20:
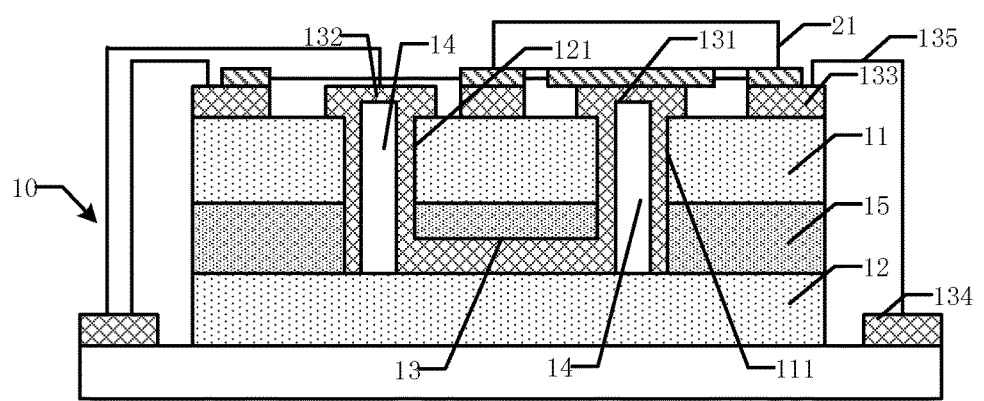
FIG. 20 is a side sectional structural schematic diagram of a power supply converter according to an exemplary implementation of the present disclosure.
Figure 21:
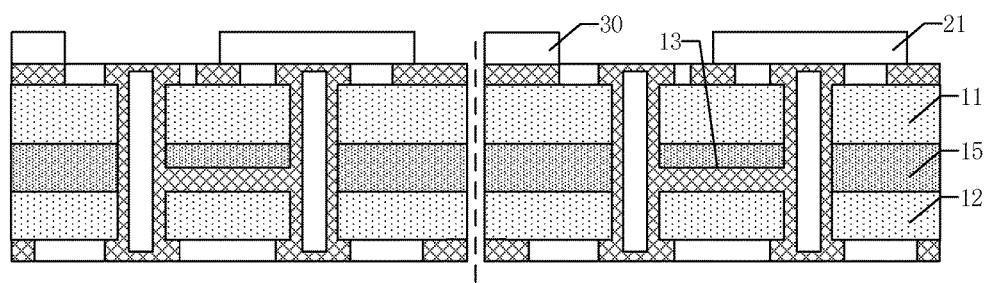
FIG. 21 is a schematic diagram illustrating the dicing of a power supply converter according to an exemplary implementation of the present disclosure.

In the above power supply converter, pins of the power supply converter may be provided on the upper surface of the first magnetic substrate 11 and the lower surface of the second magnetic substrate 12. However, in other exemplary embodiments of the present disclosure, pins of the power supply converter may be provided on the upper surface of the first magnetic substrate 11 or the lower surface of the second magnetic substrate 12. For example, referring to the power supply converter as shown in FIG. 20, the power supply converter includes an inductance component 10 and a power component 21. In the present embodiment, the inductance component includes a first magnetic substrate 11, a second magnetic substrate 12, an inductance coil 13 and a filling part 14. The first magnetic substrate 11 is provided with a first via 111 and a second via 112. The first magnetic substrate 11 has a first surface and a second surface, and the first surface of the first magnetic substrate 11 is provided with a first pin 131 and a second pin 132. The second magnetic substrate 12 has a first surface and a second surface. The inductance coil 13 is provided between the first surface of the first magnetic substrate 11 and the first surface of the second magnetic substrate 12. A first end of the inductance coil 13 is formed at the first via 111 and connected with the first pin 131, and a second end of the inductance coil 13 is formed at the second via 121 and connected with the second pin 132. The filling part 14 at least partly fills the first via 111 and the second via 121. The filling part 14 may be, for example, conductive or non-conductive material, such as copper, air or the like. The power component 21 and the inductance component 10 are stacked, and the power component 21 contacts the inductance component 10 and is coupled to the inductance component 10 by the first pin 131. Continuing to refer to FIG. 20, in addition to this, similar to the power supply converter structure as shown in FIGS. 4A and 4B, the power supply converter structure further includes a third pin 133, a fourth pin 134 and a leading wire 135. The third pin 133 is provided in the first magnetic substrate 11 and is coupled to the power component 21. The fourth pin 134 is provided below the inductance component 10. The leading wire 135 is provided along an outer side of the inductance component 10 and connects the third pin 133 and the fourth pin 134. Other parts of the power supply converter and the manufacturing method thereof may be similar to the power supply converter structure as shown in FIGS. 4A and 4B. For example, referring to FIG. 21, the composite magnetic substrate as shown in FIG. 6H is diced as shown in FIG. 21, to obtain a manner that pins are provided on the upper surface of the first magnetic substrate 11 or the lower surface of the second magnetic substrate 12, which will not be repeatedly illustrated herein.

Each of the above power supply converters includes a first magnetic substrate 11 and a second magnetic substrate 12. In other exemplary embodiments of the present disclosure, the power supply converter may only include one magnetic substrate. For example, referring to FIG. 22, the power supply converter includes an inductance component 10 and a power component 21. In the present embodiment, the inductance component includes a pre-sintered first magnetic substrate 11 and an inductance coil 13. The pre-sintered first magnetic substrate 11 is provided with a first via 111, and having a first surface and a second surface, wherein the first surface is provided with a first pin 131 and the second surface is provided with a second pin 132. The inductance coil 13 is formed at the first via 111 and connected with the first pin 131 and the second pin 132 respectively, for example, by covering copper on a surface of the first via 111 or filling conductor in the first via 111 and so on. The present disclosure is not limited to this. The power component 21 and the inductance component 10 are stacked, and the power component 21 contacts the inductance component 10 and is coupled to the inductance component 10 through the first pin 131.

Figure 22:
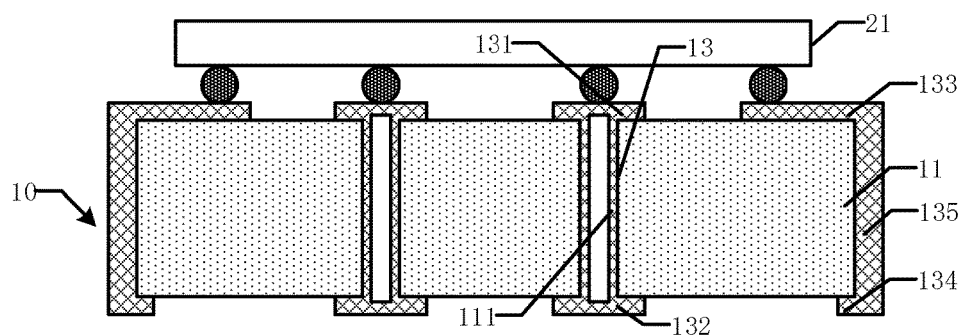
FIG. 22 is a side sectional structural schematic diagram of a power supply converter according to an exemplary implementation of the present disclosure.

In the power supply converter as shown in FIG. 22, the first magnetic substrate 11 in the inductance component 10 may be, for example, a pre-sintered magnetic component. Therefore, suitable magnetic material may be freely chosen, to achieve excellent magnetic performance. Moreover, since the first magnetic substrate 11 is sintered in advance, an inductance coil 13 may choose metallic conductive material with high cost performance, such as copper. Meanwhile, a coiling manner of a penetrating via may facilitate realizing large current demand. Further, in the above power supply converter, pins (for example, the first pin 131 and the second pin 132) may be mechanically fixed almost without wasting any space, and the power component 21 and the inductance component 10 may be stacked to improve space utilization rate of the overall structure. Thus, the power supply converter according to exemplary implementations of the present disclosure may achieve high efficiency and high power density very easily and is applicable for large current applications.

Continuing to refer to FIG. 22, in the present exemplary embodiment, the first via 111 and the inductance coil 13 may form an inductance winding combination. A number of the inductance winding combination may be one or more depending on actual needs. In addition, a structure of the power supply converter provided according to the present exemplary embodiment may further include a third pin 133, a fourth pin 134 and a leading wire 135. In the present embodiment, the third pin 133 is provided on the first surface of the first magnetic substrate 11 and is coupled to the power component 21. The fourth pin 134 is provided on the second surface of the first magnetic substrate 11. The leading wire 135 may be provided along an outer side of the inductance component 10 and connect the third pin 133 and the fourth pin 134. Depending on actual needs, the third pin 133, the fourth pin 134 and the leading wire 135 may be an integrated structure, and the power supply converter may have at least one set of the integrated structure. Hereinafter, respective parts of this type of power supply converter will be described in more detail by a specific example.

Figure 23:
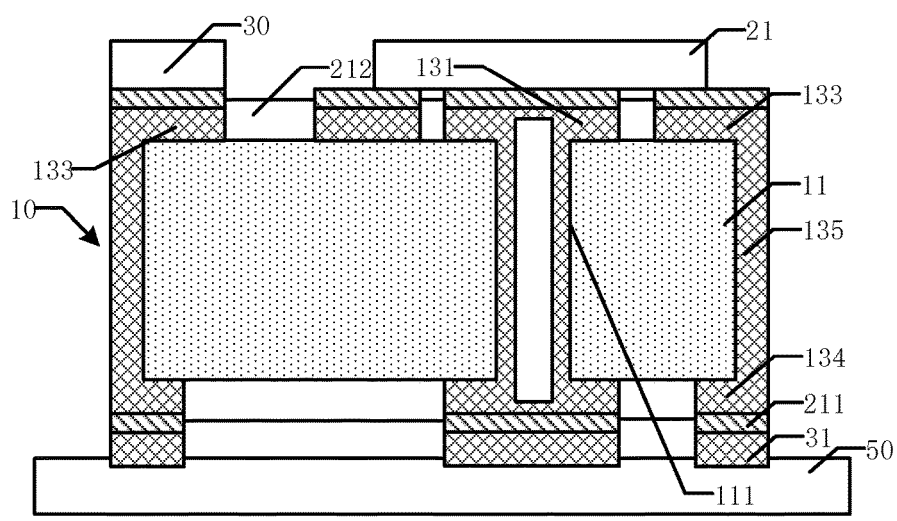
FIG. 23 is a side sectional schematic diagram of an implementation structure of a power supply converter circuit of FIG. 3.

FIG. 23 is a side sectional schematic diagram corresponding to an actual structure of another embodiment of the power supply converter in FIG. 3. Pins of the power supply converter module may be provided on the lower surface of the first magnetic substrate 11. For example, the upper surface of the first magnetic substrate 11 has a third pin 133, and the lower surface of the first magnetic substrate 11 has a fourth pin 134. The leading wire 135 connects the third pin 133 and the fourth pin 134. The solder layer 211 is used for electrically connecting the power component 21 and a first carrier plate 50. A power supply or control signal may be electrically connected to the power supply converter by the leading wire 135 provided outside the inductance component. The first pin 131 and the second pin 132 may also be used for connecting when pins of the power supply converter are provided, but the present disclosure is not limited to this. The first carrier plate 50 carries the power supply converter, and establishes electrical connections between input signals, output signals of the power supply converter and other functional modules on the first carrier plate 50.

FIGS. 24A-24F illustrate implementations of inductance windings of another power supply converter according to the present exemplary implementation.

Figure 24A:
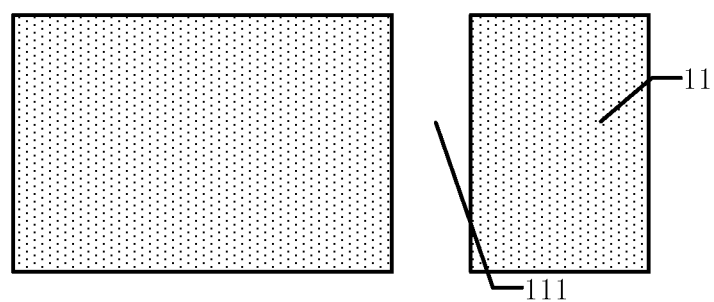
FIGS. 24A-24F are schematic diagrams illustrating a manufacture process of a power supply converter according to an exemplary implementation of the present disclosure.

As shown in FIG. 24A, a first magnetic substrate 11 is provided, and a via (for example, the first via 111 as shown in FIG. 24A) is formed at locations where the capacitor needs to be formed. At this time, since the first magnetic substrate 11 is pre-sintered, actions, such as punching, will be easily implemented.

Figure 24B:
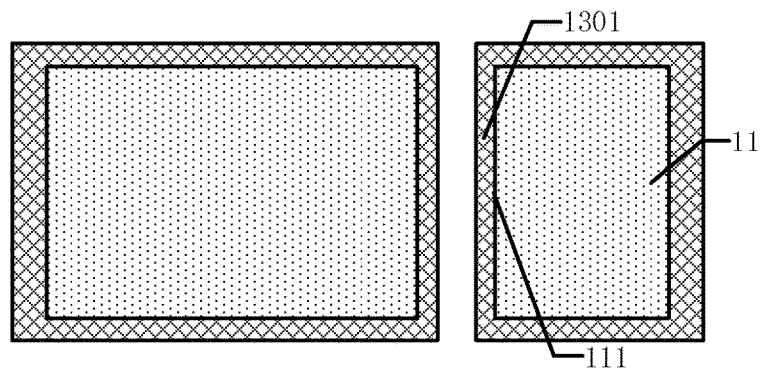

As shown in FIG. 24B, wall of the first via 111, the upper surface and the lower surface of the first magnetic substrate 11 are electroplated, to form a conductive wall. In the present exemplary implementation, a first conductor part 1301 may be, for example, a conductive layer formed on the wall of the first via 111.

Figure 24C:
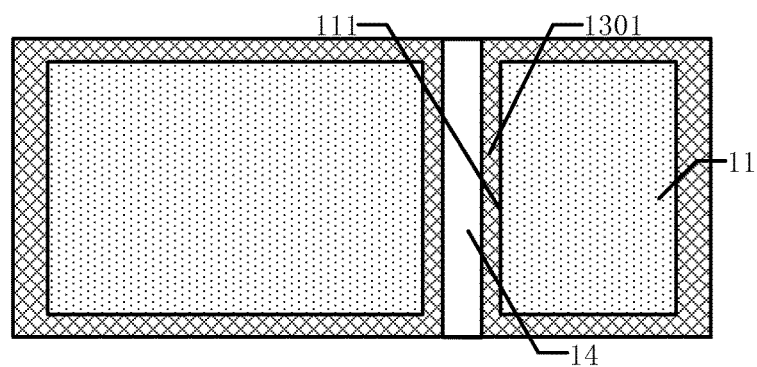

As shown in FIG. 24C, each via is filled, to obtain a filling part 14. The filling part 14 may adopt non-conductive material, such as resin, or may adopt conductive material, such as copper paste, silver paste or the like. The filling part 114 adopting conductive material may further improve conductivity of the via.

Figure 24D:
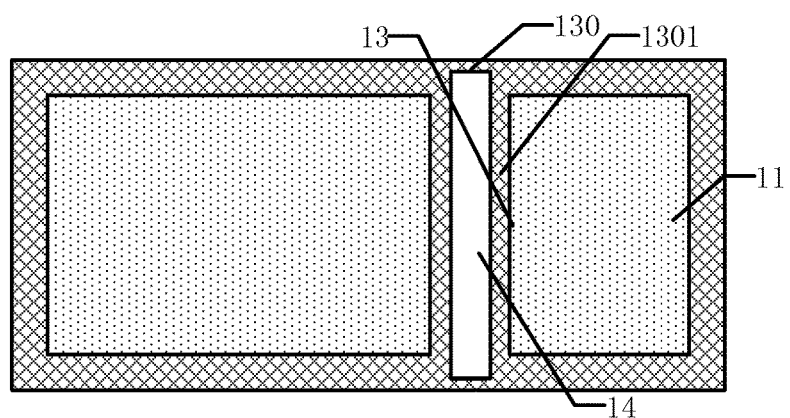

As shown in FIG. 24D, the upper surface and the lower surface of the first magnetic substrate 11, and a surface of the filling part 14 may be electroplated, to obtain a circuit layer 130.

Figure 24E:
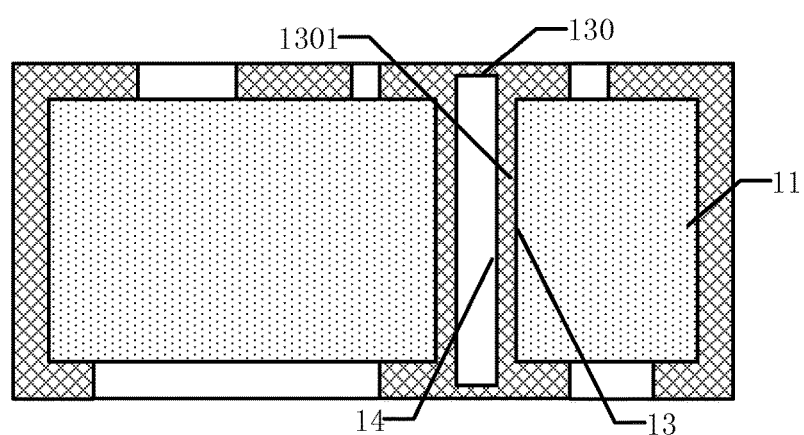

As shown in FIG. 24E, depending on needs of circuit connection, the circuit layer 130 is etched, to form respective pins as shown in the figures. Besides, an insulating layer is formed on the upper surface of the first magnetic substrate 11, a lower surface of the second magnetic substrate 12, and the circuit layer that needs to be insulated.

Figure 24F:
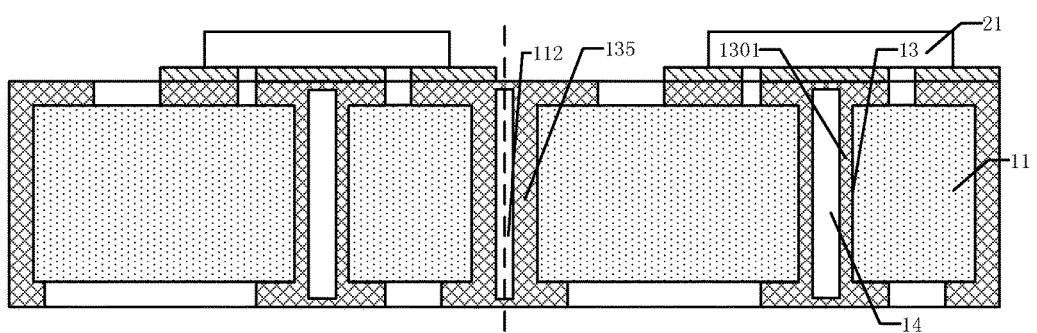

As shown in FIG. 24F, components, e.g., the power component 21 or the like may be mounted in corresponding positions of the circuit layer on a superficial layer of the inductance component 10. If a plurality of power supply converter structures need to be formed at the same time, the composite substrate obtained in FIG. 24F may be diced. For example, the number of the inductance components is at least two (there are two inductance components in FIG. 24F), and a through hole 112 is provided in the magnetic substrate 11 between the two inductance components. Conductive material, e.g., copper, is formed on the wall of the through hole 112. If the magnetic substrate 11 is diced along the through hole 112, a plurality of the inductance components (two inductance components may be obtained after being diced in FIG. 24F) may be obtained. The diced through hole 112 forms a leading wire 135 provided along an outer side of the inductance component. This method is suitable for mass production. The diced power supply converter structure in FIG. 24F may be the power supply converter structure shown in FIG. 23.

Figure 25:
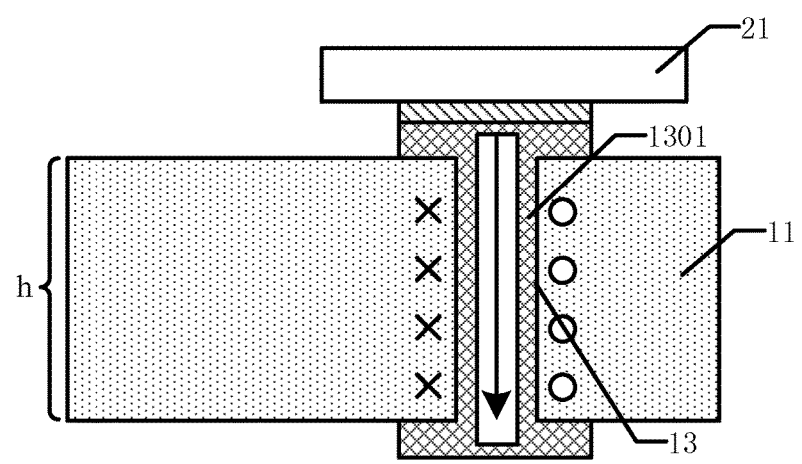
FIG. 25 is a schematic diagram illustrating an induced magnetic field of a power supply converter according to an exemplary implementation of the present disclosure.

As shown in FIG. 25, the arrow shows a flowing direction of current from the power component 21 to the output pin. When the current flows through the first conductor part 1301 as shown in FIG. 25, magnetic flux as shown in FIG. 25 is generated in the first magnetic substrate 11, wherein X represents a direction that the magnetic flux is perpendicular into a paper, and a dot represents a direction that the magnetic flux is perpendicular out from a paper. An inductance value is calculated as follows:

$$L = \frac{n^2}{\frac{2l}{\mu_a \mu_o A_e}} \quad (2)$$

wherein n is the number of turns of the inductance coil in the inductance component; l is equivalent path length of the inductance coil in the first magnetic substrate 11; $\mu_a$ is relative magnetic permeability of the first magnetic substrate 11; $\mu_o$ is permeability of vacuum; and $A_e$ is equivalent magnetic core area.

It can be known from equation (2) that, adjusting magnetic permeability of the first magnetic substrate 11 and the height h of the first magnetic substrate 11 may adjust the inductance value. When the height h of the first magnetic substrate 11 increases, $A_e$ will increase, and the inductance value will also increase accordingly. In addition, the magnetic permeability of the magnetic substrate may be directly adjusted. When the magnetic permeability of the magnetic substrate increases, the inductance value will also increase accordingly.

Figure 26:
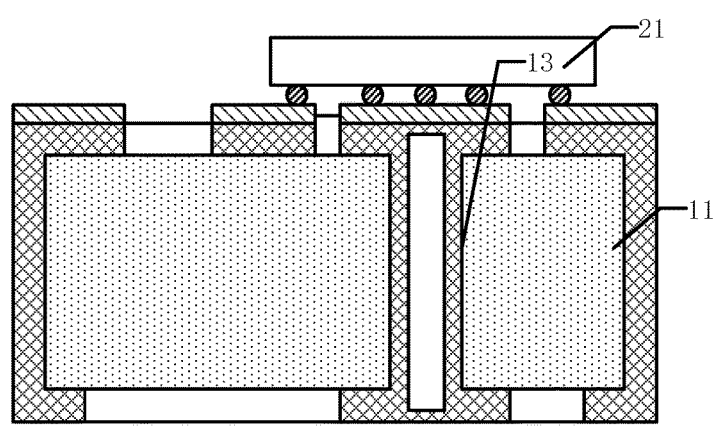
FIG. 26 is a connection schematic diagram of a power component of a power supply converter according to an exemplary implementation of the present disclosure.

After manufacturing the inductance component 10, the power component 21 containing the transistor may be mounted on the first magnetic substrate 11 in a various types of package. For example, as shown in FIG. 26, a package of ball grid array (BGA) may be employed. For another example, other types of package, such as, a lead package or a quad flat no-lead package (QFN) package form or the like may also be employed.

The power supply converter may further include other devices such as a capacitor 30, besides the inductance component 10 and a switching device. A printed circuit board may also be used as a carrier of wirings, to mount the lower surface of the printed wiring board on the first magnetic substrate 11, and to mount the above power component 21, the capacitor 30 and other devices on the upper surface of the printed wiring board.

Figure 27:
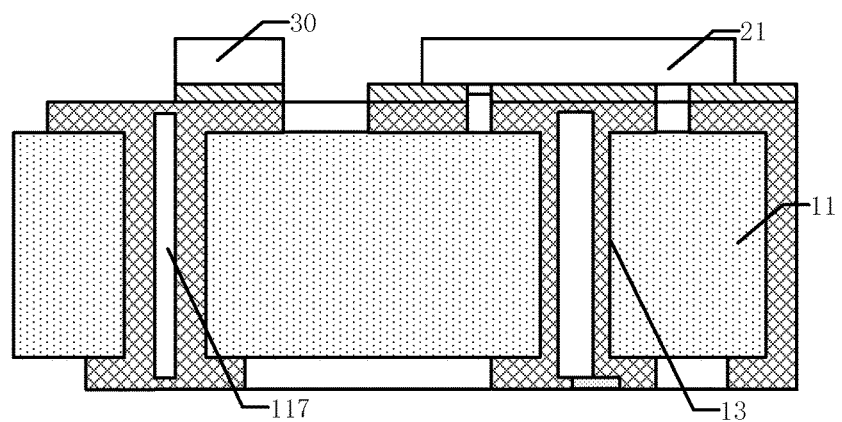
FIG. 27 is a structural schematic diagram of a power supply converter according to an exemplary implementation of the present disclosure.

As shown in FIG. 27, in other exemplary embodiments of the present disclosure, conductor layer portion of another via 117 may also be equivalent to a filter inductor L, so an LC filter may be formed with the capacitor 30 at an input end. The LC filter may inhibit high frequency switching current generated by the switching devices, and reduce electromagnetic interference on peripheral circuit by the power supply converter. An LC filter may also be formed at an output end or other locations of the circuit. The capacitor 30 is not limited to be connected to the input end, and the present disclosure is not limited to this. As shown in FIG. 27, another via 117 may be provided in the first magnetic substrate 11, and the filter inductor L is formed in the via 117. The material and a structure of the filter inductor L may be similar to those of the above inductance component 10. In mass production, in the present exemplary implementation, a plurality of vias 117 may be provided in the magnetic substrate 11, and conductive material, such as copper or the like, may be formed on walls of the vias 117. If the power supply converter is diced along the via 117, a power supply converter structure containing a plurality of inductance components 10 may be obtained. The diced through via 117 may form a leading wire 135 provided along an outer side of the inductance component. If the first magnetic substrate 11 is not diced along the via 117, a plurality of filter inductors L formed by the vias 117 may be obtained, but the present disclosure is not limited to this. For example, another via may be provided to form a filter inductor. Vias/through holes which are used for forming a filter inductor or diced to form an external wiring in respective embodiments of the present disclosure may be formed in a consistent way, or may be respectively designed according to product needs, but the present disclosure is not limited to this.

Figure 28:
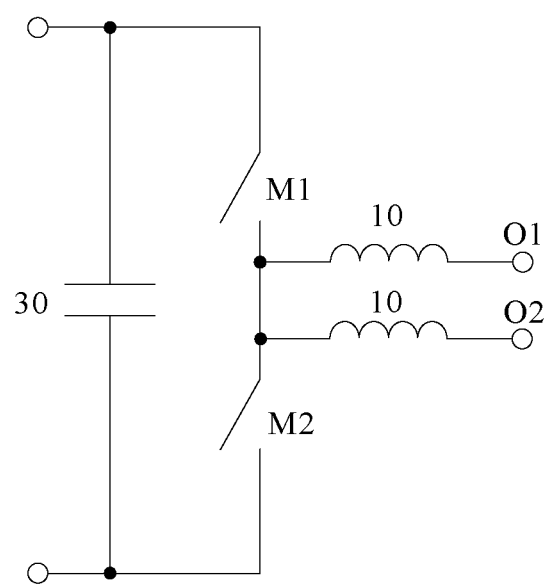
FIG. 28 is a circuit schematic diagram of a power supply converter according to an exemplary implementation of the present disclosure.
Figure 29:
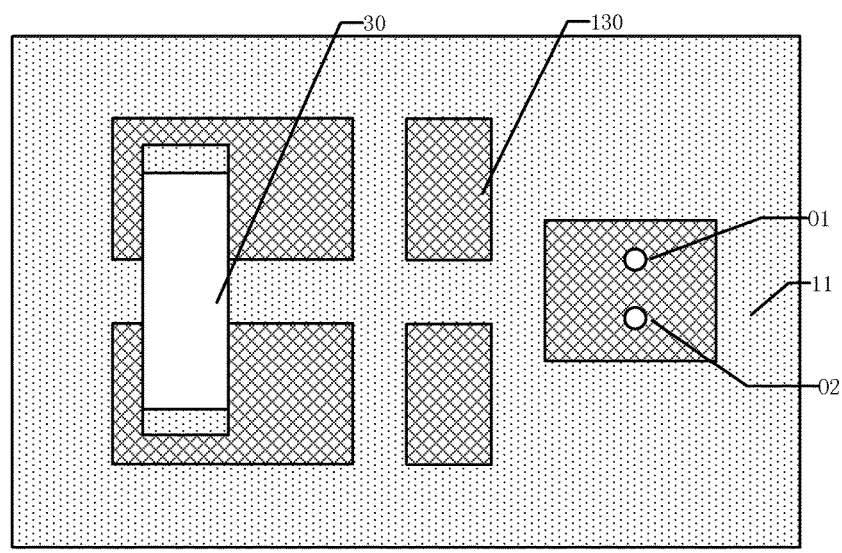
FIG. 29 is a plan structural schematic diagram of a power supply converter according to an exemplary implementation of the present disclosure.
Figure 30:
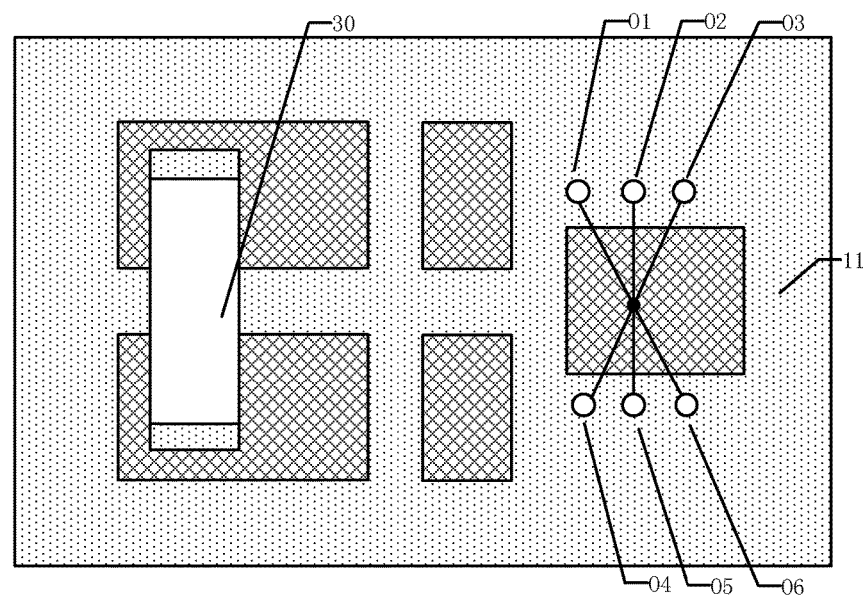
FIG. 30 is a plan structural schematic diagram of a power supply converter according to an exemplary implementation of the present disclosure.

The power supply converter as shown in FIG. 3 includes one inductance component 10. As shown in FIG. 28, in other exemplary embodiments of the present disclosure, the power supply converter may be connected with a plurality of inductance component 10 to form output terminals O1, O2 or the like. As shown in FIG. 29, the terminals O1 and O2 of the inductance component 10 are located below the power component 21, that is, the inductance component 10 and the power component 21 may be connected in a manner as shown in FIG. 29. If more inductance components 10 are needed in actual applications, an output of the power component 21 and a terminal of the inductance component 10 may be connected in a wirebond manner as shown in FIG. 30.

Figure 31:
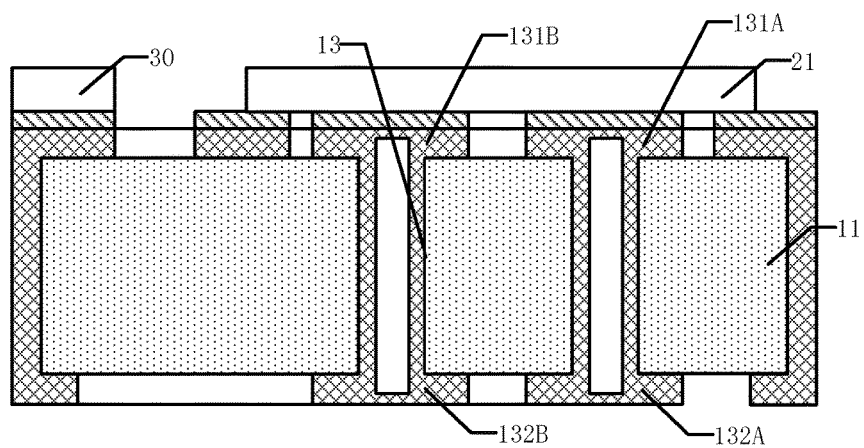
FIG. 31 is a side sectional structural schematic diagram of a power supply converter circuit of FIG. 17.

FIG. 31 is a side sectional structural schematic diagram of a power supply converter circuit of FIG. 17. In the present embodiment, according to FIG. 17 and FIG. 31, the power component 21 has at least two output ends, such as SW1 and SW2. Output ends of the inductance component 10 are O1 and O2. In FIG. 31, a pad 131A corresponds to the output end SW1 of the power component 21, a pad 131B corresponds to the output end SW2 of the power component 21, a pad 132A corresponds to the output end O1 of the inductance component 10, and a pad 132B corresponds to the output end O2 of the inductance component 10.

To sum up, in a power supply converter and a method for manufacturing the same provided by exemplary implementations of the present disclosure, a magnetic substrate in an inductance component employs a pre-sintered magnetic part, so suitable magnetic material and combination manners may be freely chosen, to achieve excellent magnetic properties. Moreover, since the magnetic substrate may be sintered in advance, an inductance coil may choose metallic conductive material with high cost performance. Meanwhile, a coiling manner of a penetrating via may facilitate realizing large current demand. Further, in the above power supply converter, pins may be mechanically fixed almost without wasting any space, and the power component and the inductance component may be stacked to improve space utilization rate of the overall structure. Thus, the power supply converter according to exemplary implementations of the present disclosure may achieve high efficiency and high power density very easily and is applicable for large current applications.

The present disclosure has been described with reference to the above related exemplary embodiments, while the above embodiment is only an example of implementing the present disclosure. It should be pointed out that the disclosed embodiment does not limit the scope of the present disclosure. Instead, changes and modifications without departing from the spirit and scope of the present disclosure all belong to the patent protection scope of the present disclosure.

What is claimed is:

1. A power supply converter, comprising an inductance component and a power component, wherein the inductance component comprises:

a first magnetic substrate, provided with a first via, the first magnetic substrate including a first surface and a second surface, and a first pin being provided on the first surface;

a second magnetic substrate, provided with a second via, and having a first surface provided with a second pin and a second surface opposite to the second surface of the first magnetic substrate;

an inductance coil, provided between the first surface of the first magnetic substrate and the first surface of the second magnetic substrate, and having a first end formed at the first via and connected with the first pin, and a second end formed at the second via and connected with the second pin; and a filling part, at least partly filling the first via and the second via, wherein the power component and the inductance component are stacked, and the power component contacts the inductance component and is coupled to the inductance component by the first pin, and wherein an inductance value of the inductance component is related to magnetic permeability and thickness of the filling part.

2. The power supply converter according to claim 1, wherein the power supply converter contains a plurality of the inductance coils, and the plurality of the inductance coils are connected at the first via or the second via.

3. The power supply converter according to claim 1, wherein the power supply converter further comprises:
a third pin, provided on the first surface of the first magnetic substrate and being coupled to the power component;
a fourth pin, provided on the first surface of the second magnetic substrate; and
a leading wire, provided along an outer side of the inductance component and connecting the third pin and the fourth pin.

4. The power supply converter according to claim 3, wherein the third pin, the fourth pin and the leading wire are formed in an integrated structure, and the power supply converter has at least one set of the integrated structure.

5. The power supply converter according to claim 1, wherein the inductance coil comprises a first conductor part formed at the first via, a second conductor part formed between the first magnetic substrate and the second magnetic substrate and a third conductor part formed at the second via.

6. The power supply converter according to claim 5, wherein a containing groove is provided in the first magnetic substrate or the second magnetic substrate, and the second conductor part is provided in the containing groove.

7. The power supply converter according to claim 5, wherein the second conductor part of the inductance coil comprises at least one layer of coil.

8. The power supply converter according to claim 1, wherein the first via and the second via directly face each other, or are offset from each other.

9. The power supply converter according to claim 1, wherein the first pin is provided at the first via and the second pin is provided at the second via.

10. The power supply converter according to claim 1, wherein the power component comprises a half-bridge arm, and a midpoint of the half-bridge arm is coupled to the first pin.

11. The power supply converter according to claim 1, wherein an operating frequency of the power supply converter is greater than or equal to 3 MHz, an output voltage is smaller than or equal to 2.5V, and an overall height of the power supply converter is smaller than or equal to 2 mm.

12. The power supply converter according to claim 1, wherein the power supply converter further comprises:
a capacitor;
a filter inductor, coupled to the power component and the capacitor, and forming an LC filter with the capacitor, wherein the first magnetic substrate is provided with a third via and the second magnetic substrate is provided with a fourth via, the filter inductor is provided between the first surface of the first magnetic substrate and the first surface of the second magnetic substrate and the filter inductor has a first end formed at the third via and a second end formed at the fourth via.

13. A power supply converter, comprising an inductance component and a power component, wherein the inductance component comprises:
a first magnetic substrate, provided with a first via and a second via, the first magnetic substrate including a first surface and a second surface, and a first pin being provided on the first surface;
a second magnetic substrate;
an inductance coil, provided between the first magnetic substrate and the second magnetic substrate, and having a first end formed at the first via and connected with the first pin and a second end formed at the second via and connected with the second pin; and
a filling part, at least partly filling the first via and the second via,
wherein the power component and the inductance component are stacked, and the power component contacts the inductance component and is coupled to the inductance component through the first pin, and
wherein the power component comprises a half-bridge arm, and a midpoint of the half-bridge arm is coupled to the first pin.

14. The power supply converter according to claim 13, wherein the power supply converter further comprises:
a third pin, provided in the first magnetic substrate and being coupled to the power component;
a fourth pin; and
a leading wire, provided along an outer side of the inductance component and connecting the third pin and the fourth pin.

15. The power supply converter according to claim 13, wherein the power supply converter further comprises:
a capacitor;
a filter inductor, coupled to the power component and the capacitor, and forming an LC filter with the capacitor, wherein the first magnetic substrate is provided with a third via and a fourth via, the filter inductor is provided between the first magnetic substrate and the second magnetic substrate, and the filter inductor has a first end formed at the third via and a second end formed at the fourth via.

16. A power supply converter, comprising an inductance component and a power component, wherein the inductance component comprises:
a pre-sintered magnetic substrate, provided with a via, the first magnetic substrate including a first surface and a second surface, and a first pin being provided on the first surface; and
an inductance coil, formed at the via and connected with the first pin and the second pin respectively,
wherein the power component and the inductance component are stacked, and the power component contacts the inductance component and is coupled to the inductance component by the first pin, and
wherein the power component comprises a half-bridge arm, and a midpoint of the half-bridge arm is coupled to the first pin.

17. The power supply converter according to claim 16, wherein the power supply converter further comprises:
a third pin, provided on the first surface of the magnetic substrate and being coupled to the power component;
a fourth pin, provided on the second surface of the magnetic substrate; and a leading wire, provided along an outer side of the inductance component and connecting the third pin and the fourth pin.

18. The power supply converter according to claim 16, wherein the power supply converter further comprises:
a capacitor; and
a filter inductor, coupled to the power component and the capacitor, and forming an LC filter with the capacitor, wherein the first magnetic substrate is provided with another via and the filter inductor is formed at the another via.

19. A method for manufacturing a power supply converter, comprising manufacturing an inductance component and providing a power component, wherein the manufacturing an inductance component comprises:
providing a pre-sintered first magnetic substrate having a first surface and a second surface, providing a first via in the first magnetic substrate, and forming a first pin on a first surface of the pre-sintered first magnetic substrate;
providing a pre-sintered second magnetic substrate having a first surface and a second surface, providing a second via in the second magnetic substrate, and forming a second pin on a first surface of the pre-sintered second magnetic substrate;
forming an inductance coil between the first magnetic substrate and the second magnetic substrate, a first end of the inductance coil being formed at the first via and connected with the first pin, and a second end of the inductance coil being formed at the second via and connected with the second pin;
forming a filling part, for filling the first via and the second via; and
stacking the power component and the inductance component, the power component contacting the inductance component and being coupled to the inductance component by the first pin,
wherein the manufacturing an inductance component comprises:
a number of the inductance component being at least two, and providing a through hole in the first magnetic substrate and the second magnetic substrate between the at least two inductance components; and
dicing the first magnetic substrate and the second magnetic substrate along the through hole to obtain a plurality of the inductance components, wherein the diced through hole forms a leading wire provided along an outer side of the inductance component.

20. The method according to claim 19, wherein the method further comprises manufacturing a plurality of filter inductors, the manufacturing a plurality of filter inductors comprising:
providing a plurality of third vias in the first magnetic substrate;
providing a plurality of fourth vias in the second magnetic substrate; and
forming the filter inductor at the third vias and the fourth vias.

21. A method for manufacturing a power supply converter, comprising manufacturing an inductance component and providing a power component, wherein the manufacturing an inductance component comprises:
providing a pre-sintered magnetic substrate having a first surface and a second surface, providing a first via in the magnetic substrate, and forming a first pin on the first surface and a second pin on the second surface;
forming an inductance coil at the first via, a first end of the inductance coil being connected with the first pin, and a second end of the inductance coil being connected with the second pin; and
stacking the power component and the inductance component, the power component contacting the inductance component and being coupled to the inductance component by the first pin,
wherein the manufacturing an inductance component comprises:
a number of the inductance component being at least two, and providing a through hole in the magnetic substrate and between the at least two inductance components; and
dicing the magnetic substrate along the through hole to obtain a plurality of the inductance components, wherein the diced through hole forms a leading wire provided along an outer side of the inductance component.

22. The method according to claim 21, wherein the method further comprises manufacturing a plurality of filter inductors, the manufacturing a plurality of filter inductors comprising:
providing a plurality of second vias in the magnetic substrate; and
forming the filter inductor at the second vias.

* * * * *